(12) United States Patent
Kawakami et al.

(10) Patent No.: US 6,364,953 B1
(45) Date of Patent: Apr. 2, 2002

(54) METHOD AND APPARATUS FOR MAKING AEROGEL FILM

(75) Inventors: Nobuyuki Kawakami; Yoshito Fukumoto; Kenichi Inoue; Kohei Suzuki; Takashi Kinoshita, all of Kobe; Katsuhiro Uehara, Takasago, all of (JP)

(73) Assignee: Kabushiki Kaisha Kobe Seiko Sho., Hyogo (JP)

( * ) Notice: Subject to any disclaimer, the term of this patent is extended or adjusted under 35 U.S.C. 154(b) by 0 days.

(21) Appl. No.: 09/577,028

(22) Filed: May 23, 2000

(30) Foreign Application Priority Data

Jun. 23, 1999 (JP) ............................................ 11-177262

(51) Int. Cl.$^7$ .......................... B05C 11/00; B05C 11/02

(52) U.S. Cl. ...................... 118/665; 118/689; 118/690; 118/691; 118/699; 118/52; 118/75

(58) Field of Search ................................ 118/663, 688, 118/691, 689, 52, 665, 690, 699, 75; 438/789, 788, 787, 782, 790; 427/425, 240; 34/470, 529, 562, 565, 58, 61, 88

(56) References Cited

U.S. PATENT DOCUMENTS

| 4,610,863 A | * | 9/1986 | Tewari et al. | 423/338 |
| 4,971,654 A | * | 11/1990 | Schnegg et al. | 156/638 |
| 5,763,883 A | * | 6/1998 | Descales et al. | 250/339.09 |
| 5,932,111 A | * | 8/1999 | Christensen et al. | 210/748 |
| 5,968,268 A | * | 10/1999 | Kitano et al. | 118/52 |
| 6,067,728 A | * | 5/2000 | Farmer et al. | 24/470 |

FOREIGN PATENT DOCUMENTS

| JP | 08-228105 | 9/1996 |
| JP | 09-213797 | 8/1997 |

* cited by examiner

*Primary Examiner*—Richard Crispino
*Assistant Examiner*—Kevin P. Shortsle
(74) *Attorney, Agent, or Firm*—Reed Smith LLP

(57) ABSTRACT

A method for making an aerogel film includes the steps of performing a gelation reaction of a metal alkoxide on a substrate to prepare a substrate with a wet-gel film, and converting the wet-gel film into an aerogel film by a supercritical or sub-critical drying process of the substrate with the wet-gel film, wherein the degree of gelation of the wet-gel film is controlled to be a predetermined value at the start of the supercritical or sub-critical drying process. Aerogel films having uniform qualities are produced by the supercritical or sub-critical drying process in one lot.

14 Claims, 14 Drawing Sheets

METHOD AND APPARATUS FOR MAKING AEROGEL FILM

BACKGROUND OF THE INVENTION

1. Field of the Invention

The present invention relates to a method and to an apparatus for making an aerogel film which is porous, exhibits a low dielectric constant and low signal loss, and may be used as a dielectric layer in a high-frequency circuit and an insulating interlayer in a semiconductor device such as an LSI. The method and the apparatus can minimize variations in film characteristics, such as thickness, porosity, and dielectric constant.

In particular, the present invention relates to a method and to an apparatus for making an aerogel film having stable qualities which can minimize variations in film characteristics, such as thickness, porosity, and dielectric constant, among a plurality of substrates with aerogel films from one production lot when these substrates with gel films are produced by a simultaneous supercritical or sub-critical drying process so as to control gelation reactions in the wet-gel films.

2. Description of the Related Art

Microwave circuits for portable phones, satellite broadcasts, and telecommunications employ integrated circuits using microstrips instead of conventional waveguides or coaxial cables.

With reference to FIG. 1A, a single-layered microstrip includes a substrate 1, a base layer 2 formed on the substrate 1 by metallization or the like, a dielectric layer 3 formed on the base layer 2, and a conductive microstrip line 4 formed on the dielectric layer 3. With reference to FIG. 1B, a multilayered microstrip including a plurality of the single-layered microstrips shown in FIG. 1A is also used.

Fluoride glass and alumina ceramics have been used for the dielectric layers 3 and the insulating interlayer 5 of such microstrips. In recent years, however, dielectric materials having smaller dielectric constants and smaller signal losses have been required. Japanese Unexamined Patent Application Publication No. 8-228105 discloses a porous ceramic meeting such a requirement.

Japanese Unexamined Patent Application Publication No. 9-213797 discloses a method for making a semiconductor device. In the method, a wet-gel film is formed on a substrate, and a solvent contained in the wet gal film is evaporated by a supercritical or sub-critical drying process to form an aerogel film. Next, the aerogel film is patterned. In more detail, a stock solution containing a metal alkoxide (tetraethoxysilane), a solvent (ethanol), water, and a catalyst is spin-coated onto a rotating substrate. Silicon alkoxide in the stock solution is hydrolyzed to form silicon hydroxide. The silicon hydroxide forms a network of siloxane bonds containing the residual solvents by condensation. That is, a wet-gel film of a silica skeleton containing the solvents is formed on the substrate. When the wet-gel film is dried by a supercritical or sub-critical drying process, a silica aerogel having a low dielectric constant is formed by replacement of the residual solvent with air.

Herein, "supercritical drying" means that a solvent or water is in a supercritical state in which the solvent or water is present as both gas and liquid. The supercritical drying state is achieved under high-temperature and high-pressure conditions which is above the critical point of the solvent. In the supercritical drying process, no gas-liquid interface is formed in the gel. Thus, no stress due to capillary force is applied to the gel skeleton. As a result, the solvent remaining in the gap of the network skeleton can be substantially removed without shrinkage of the wet gel. "Sub-critical drying" means drying performed in a sub-critical state which is a high-temperature and high-pressure state near the supercritical state. In the sub-critical drying, the solvent can also be substantially removed without shrinkage of the wet gel. The resulting dried gel (aerogel) film still maintains the network structure of the wet-gel film, and is a porous material having a significantly high porosity and a significantly low relative permittivity. Accordingly, aerogels are expected to be used as new materials for the dielectric layer and the insulating interlayer.

Silicon alkoxide, however, is readily condensed in the presence of a catalyst, that is, is rapidly gelated. Thus, production of aerogel films has the following disadvantages.

When a stock solution containing silicon alkoxide, water, alcohol, and a catalyst is prepared for a wet-gel film in an amount sufficient to coating a plurality of substrates and is spin-coated on these substrates, elapsed times from the preparation of the stock solution to the spin coating differ between these substrates. Since condensation or gelation proceeds in the stock solution immediately after the stock solution is prepared, the viscosity of the stock solution increases over time. When the spin coating is performed at a constant rotation rate, the thickness of the film coated on the substrate increases as the viscosity of the stock solution increases. That is, the thickness of the film on a later substrate is larger than that on an earlier substrate. As the gelation proceeds further, a thin-film cannot be formed on the substrate due to extremely high viscosity. Moreover, the water and the catalytic component in the stock solution will be evaporated during the coating, and thus the gelation will not proceed further. As a result, a high-quality wet-gel film cannot be formed on the substrate.

A possible method for solving the above problem is preparation of stock solutions for the plurality of substrates so that the elapsed times from the preparation to the coating of the stock solutions are the same. Since the viscosities of these solutions are the same during the coating steps, the thicknesses of the films can be equal to each other by fixing the rotation of the substrate.

When the degrees of gelation differ between the substrates at the start of the supercritical or sub-critical drying process, the resulting aerogel films have different porosities even if the wet-gel films have the same thickness.

As a result, the aerogel films do not have uniform, reproducible qualities. For example, aerogel films may be mass-produced by a method shown in FIGS. 2A to 2D. Stock solutions having the same viscosity or the same degree of gelation are applied onto substrates 10 to prepare substrates 12 with wet-gel films 11 having the same thickness, and then these substrates 12 are placed into a holder 13 (hereinafter, a substrate 12 with a wet-gel film is referred to as a "wet-gel-film-substrate"). After a predetermined number (six in FIG. 2C) of wet-gel-film-substrates 12 is placed into the holder 13, the holder 13 is transferred into a hermetically sealed container 14 for supercritical or sub-critical drying. In this case, for example, the first wet-gel-film-substrate 12a is subjected to the supercritical or sub-critical drying after a longer holding time compared to the last wet-gel-film-substrate 12f. That is, the wet-gel-film-substrates 12a, 12b, . . . , 12f in the holder 13 have different holding times before the supercritical or sub-critical drying. Thus, the degrees of gelation of the wet-gel films on these wet-gel-film-substrates 12a, 12b, . . . , 12f differ from each other at the start of the supercritical or sub-critical drying process, even if the applied stock solutions have the same viscosity or even if the gelation reaction starts after the stock solutions are applied onto the substrates. Such a difference in the degrees of gelation causes differences in porosities of the silica aerogel films obtained by the supercritical or sub-critical drying. Accordingly, the aerogel films obtained by the same supercritical or sub-critical drying process have different properties, e.g., dielectric constant and hydrophobicity. The quality of the aerogel films produced in one lot is, therefore, not uniform.

SUMMARY OF THE INVENTION

Accordingly, it is an object of the present invention to provide a method and an apparatus for making an aerogel film having uniform qualities by a supercritical or sub-critical drying process.

It is another object of the present invention to provide a method and an apparatus for simultaneously making a plurality of aerogel films having uniform qualities by a supercritical or sub-critical drying process.

The present inventors have completed the present invention under viewpoints that the gelation reaction is suppressed before supercritical or sub-critical drying to control the degree of gelation of the wet-gel-film-substrate to a predetermined level at the start of the supercritical or sub-critical drying, and that the degree of gelation is measured to determine the start of the supercritical or sub-critical drying.

A method for making an aerogel film in accordance with the present invention includes the steps of performing a gelation reaction of a metal alkoxide on a substrate to prepare a substrate with a wet-gel film, and converting the wet-gel film into an aerogel film by a supercritical or sub-critical drying process of the substrate with the wet-gel film, wherein the degree of gelation of the wet-gel film is controlled to be a predetermined value at the start of the supercritical or sub-critical drying process.

In a preferred embodiment for controlling the degree of gelation of the wet-gel film, the supercritical or sub-critical drying process simultaneously performs supercritical or sub-critical drying of a predetermined number of substrates with wet-gel films which are sequentially produced, and the degrees of gelation of the wet-gel films on the predetermined number of substrates are controlled to be substantially the predetermined value.

In another preferred embodiment for controlling the degree of gelation of the wet-gel film, the gelation reaction is suppressed before the supercritical or sub-critical drying process, and is then released from the suppression or is promoted so as to control the degree of the gelation of the wet-gel film to the predetermined value. In such a case, the gelation reaction is suppressed by maintaining the substrate with the wet-gel film at a low temperature before the supercritical or sub-critical drying process, and is then released from the suppression or is promoted by increasing the temperature of the substrate with the wet-gel film. Alternatively, the gelation reaction is suppressed with a gelation retarder before the supercritical or sub-critical drying process, and is then released from the suppression or is promoted by heating the substrate with the wet-gel film or by irradiating the substrate with the wet-gel film with electromagnetic waves to decompose the gelation retarder. Preferably, the gelation retarder is an organic acid.

In another preferred embodiment for controlling the degree of gelation of the wet-gel film, before the supercritical or sub-critical drying process, the gelation reaction rate of the wet-gel film on the substrate is controlled in response to the time from the start of the gelation reaction of the wet-gel film on the substrate to the start of the supercritical or sub-critical drying process so as to control the degree of the gelation of the wet-gel film to the predetermined value. In this embodiment, the gelation reaction rate is preferably controlled by at least one the type and the amount of at least one reagent of a gelation promoter and a gelation retarder. Alternatively, the supercritical or sub-critical drying process simultaneously performs supercritical or sub-critical drying of a predetermined number of substrates with wet-gel films which are sequentially produced, a holding time from the start of the gelation reaction to the start of the supercritical or sub-critical drying process is calculated for each substrate with the wet-gel film, and at least one of the type and amount of at least one of the gelation promoter and the gelation retarder is changed based on the holding time to control the gelation reaction rate. Preferably, the pH of the gelation promoter is 4 or less or 10 or more at the start of the gelation reaction. More specifically, the gelation promoter is one of hydrochloric acid and ammonia. Preferably, the gelation retarder is an organic acid.

In a preferred embodiment, the degree of gelation of the wet-gel film on the substrate is measured and the supercritical or sub-critical drying process is initiated when the degree of gelation reaches the predetermined value G. Preferably, the degree of gelation of the wet-gel film is determined by measuring the intensity of light absorption or light scattering of the wet-gel film. Alternatively, the supercritical or sub-critical drying process is started after a predetermined elapsed time from the time when the gelation reaction is released from the suppression or is promoted.

In a preferred embodiment, the substrate with the wet-gel film is prepared by applying a stock solution containing the metal alkoxide, water, and a gelation promoter and/or a gelation retarder onto the rotating substrate. Preferably, the degree of gelation of the stock solution is measured and the rotation rate of the substrate is determined in response to the degree of gelation so that the thickness of the wet-gel film is uniform. Preferably, the degree of gelation of the stock solution is measured by intensity of light absorption or light scattering of the stock solution, or the degree of gelation of the stock solution is measured by the viscosity of the stock solution.

In another preferred embodiment, the substrate with the wet-gel film is prepared by supplying the metal alkoxide on the substrate and then supplying water and a gelation promoter and/or a gelation retarder thereon. Preferably, a viscosity modifier is preliminarily added to the metal alkoxide. Preferably, the gelation promoter and/or the gelation retarder are supplied by holding the substrate in an environment containing the gelation promoter and/or the gelation retarder in a gaseous state. Alternatively, the substrate with the wet-gel film is prepared by substantially simultaneously supplying the metal alkoxide and a gelation promoter and/or a gelation retarder onto the substrate. Alternatively, the substrate with the wet-gel film is prepared by mixing and simultaneously supplying the metal alkoxide, water, and a gelation promoter and/or a gelation retarder onto the substrate.

An apparatus for making an aerogel film in accordance with the present invention includes substrate supporting means for supporting a substrate, wet-gel film forming means for forming a wet-gel film on the substrate supported by the substrate supporting means, holding means for holding the substrate with the wet-gel film, supercritical or sub-critical drying means for drying the substrate with the wet-gel film held in the holding means in a supercritical or sub-critical medium, and supercritical or sub-critical drying control means for initiating the supercritical or sub-critical drying by the supercritical or sub-critical drying means when the degree of gelation of the wet-gel film on the substrate held in the holding means reaches a predetermined value.

Preferably, the supercritical or sub-critical drying control means includes a calculation unit for determining the time J when the degree of gelation reaches a predetermined value G, and a first supercritical or sub-critical initiating unit which submits a command for initiating the supercritical or sub-critical drying at the time J. Alternatively, the supercritical or sub-critical drying control means includes a gelation measuring unit for measuring the degree of gelation of the wet-gel film on the substrate held on the holding means, and a second supercritical or sub-critical initiating unit for initiating the supercritical or sub-critical drying when the degree of gelation of the wet-gel film measured by the gelation measuring unit reaches a predetermined value. In such a case, the gelation measuring unit preferably determines the degree of gelation of the wet-gel film by the intensity of light absorption or light scattering.

Preferably, the holding means is provided with temperature controlling means for controlling the gelation reaction rate, or the holding means is provided with electromagnetic wave irradiation means for releasing the gelation reaction from the suppression.

Preferably, the substrate supporting means includes detecting means for detecting the time when the wet-gel film is formed by the wet-gel film forming means, and composition selecting means for determining at least one of the type and amount of a gelation promoter and/or a gelation retarder in response to the detected time.

The wet-gel film forming means may be a type which supplies a stock solution, or may be a type which separately supplies a metal alkoxide and a gelation promoter.

In a preferred embodiment, the wet-gel film forming means includes a stock solution reservoir containing a metal alkoxide, water, and the gelation promoter and/or the gelation retarder, and stock solution supplying means for supplying the stock solution in the stock solution reservoir onto the substrate on the substrate supporting means. In such a case, the wet-gel film forming means may be provided with first composition controlling means for controlling the composition of the stock solution. Preferably, the first composition controlling means determines at least one of the type and the concentration of the gelation promoter and/or the gelation retarder contained in the stock solution reservoir, based on the results selected by the composition selecting means.

Preferably, the substrate supporting means rotates and supports the substrate, and includes gelation measuring means for measuring the degree of gelation of the stock solution in the stock solution reservoir, and rotation controlling means for controlling the rotation rate of the substrate in response to the measured degree of gelation.

In another preferred embodiment, the wet-gel film forming means includes a first reservoir containing a metal alkoxide, a second reservoir containing water initiating the gelation reaction of the metal alkoxide and a gelation promoter and/or gelation retarder for promoting or suppressing the gelation reaction, and supplying means for supplying the metal alkoxide from the first reservoir and the gelation promoter and/or the gelation retarder from the second reservoir onto the substrate. Preferably, the wet-gel film forming means further includes second composition controlling means for controlling at least one of the type and the amount of the gelation promoter and/or gelation retarder in the second reservoir. Preferably, the second composition controlling means controls at least one of the type and the amount of the gelation promoter and/or the gelation retarder in the second reservoir, based on the results selected by the composition selecting means.

According to the method for making the aerogel film, the degree of gelation of the wet-gel film on the substrate is controlled to be a predetermined level before supercritical or sub-critical drying. At the predetermined level, the specific dielectric constant is minimized. Thus, the resulting aerogel film has high qualities, that is, small variations in porosity and specific dielectric constant. When a predetermined number of wet-gel-film-substrates which are sequentially produced are simultaneously subjected to supercritical or sub-critical drying, the degrees of gelation of the wet-gel films are controlled to be substantially the same level at the start of the supercritical or sub-critical drying. Thus, variations in film thickness and film characteristics between substrates can be suppressed. The resulting aerogel films exhibit high qualities, that is, small variations in porosity and specific dielectric constant.

In the method for making the aerogel film of the present invention, the gelation of the metal alkoxide is readily controlled by the types and the amounts of the gelation promoter and/or the gelation retarder.

The apparatus for making the aerogel film according to the present invention can efficiently produce high-quality aerogel films. Since the start of the supercritical or sub-critical drying can be appropriately changed by the predetermined degree of gelation, which depends on the composition of the gelation initiator solution and the gelation reaction rate, this apparatus is applicable to various types of metal alkoxides, gelation promoters, and gelation retarders.

DESCRIPTION OF THE PREFERRED EMBODIMENTS

A method for measuring the degree of gelation of stock solutions and wet-gel films used in the present invention will be described.

Measurement of Degree of Gelation

The degree of gelation can be determined by (1) light absorption or light scattering or (2) viscosity of the solution or film. The degree of gelation represents the degree of crosslinking in a network structure. As the degree of gelation increases, the porosity of the aerogel film generally increases.

(1) Measurement by Light Absorption or Light Scattering

The gelation reaction of tetravalent-metal alkoxides such as tetraalkoxysilane includes hydrolysis of tetraalkoxysilane to form silanetetraol, as represented by the equation (1), and condensation of the silanetetraol, as represented by the equation (2):

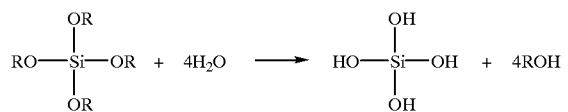

(1)

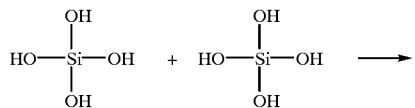

(2)

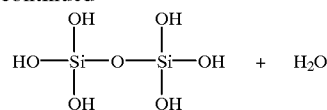

In the equations, R is alkyl, e.g., methyl or ethyl. Alkoxides of tetravalent metals other than silicon also cause gelation.

A change in a molecular bonding state due to the gelation reaction can be observed by a change in absorption or scattering of infrared rays, ultraviolet rays, or X-rays. For example, the content of the Si—O—Si bond increases with the gelation, and the infrared absorption near 1,035 cm$^{-1}$ due to the Si—O—Si bond increases. Thus, the degree of gelation can be determined by the absorbance near 1,035 cm$^{-1}$.

The method by light absorption or light scattering is applicable to both the stock solution and the wet-gel film formed on the substrate. Herein, the stock solution means a mixture of a metal alkoxide, alcohol, water as an initiator for gelation, and a gelation promoter and/or a gelation decelerator which accelerate and/or decelerate the gelation. The gelation starts in the stock solution and the wet-gel film can be formed only by the stock solution.

Figure 3:
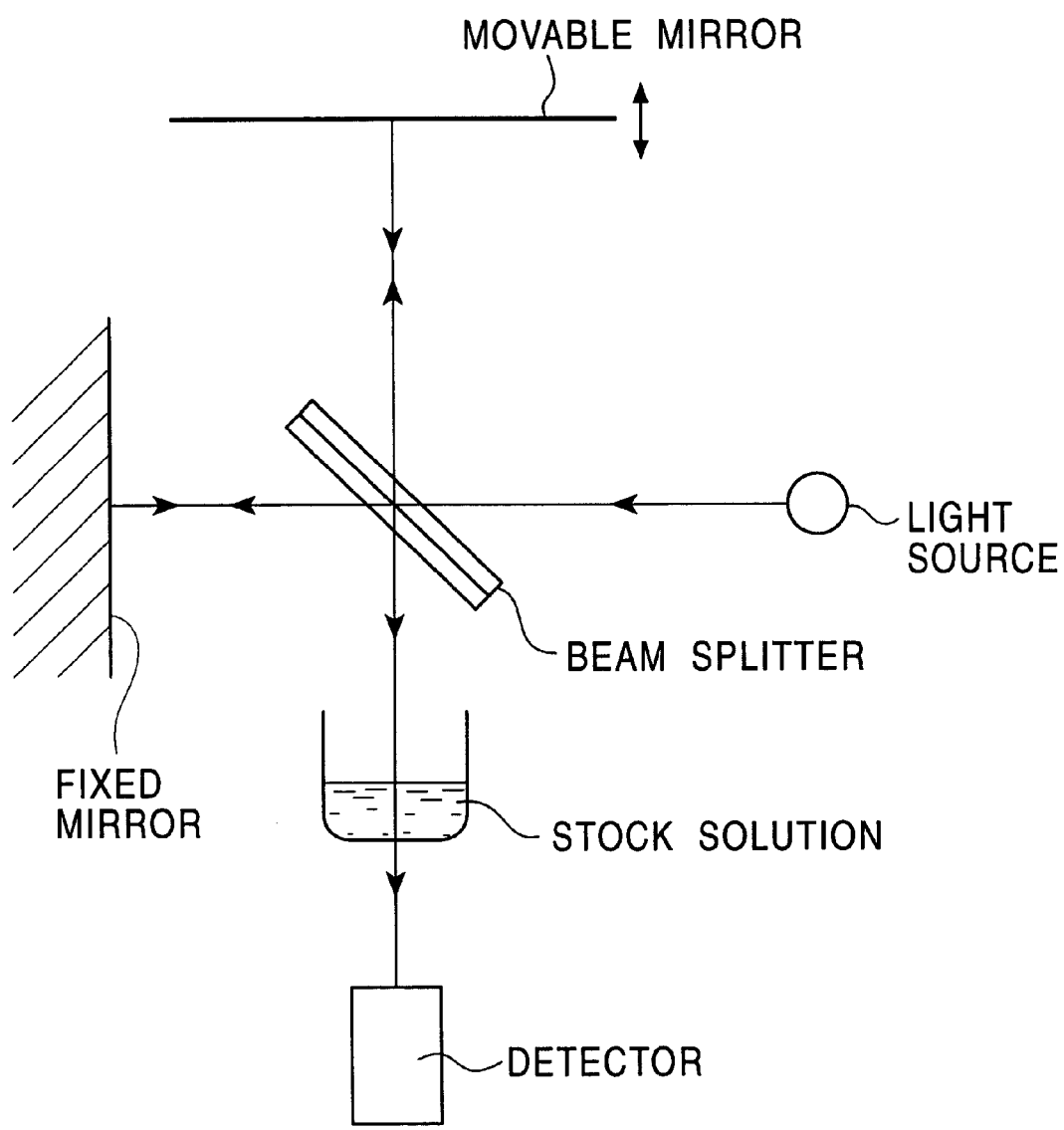
FIG. 3 is a schematic view of a method for measuring the degree of gelation of a stock solution by light absorption.

The degree of gelation of the stock solution may be determined using an apparatus shown in FIG. 3. Light (infrared light) from a light source is equally divided into two light components by a beam splitter. One light component is reflected by a fixed mirror and the other light component is reflected by a movable mirror. The reflected light components are recombined by the beam splitter and cause interference due to optical path differences. An interference pattern of the reflected light components, which pass through the stock solution, is observed by a detector. The interference pattern is converted to an infrared spectrum as shown in FIG. 4 by Fourier transformation using a computer.

Figure 4:
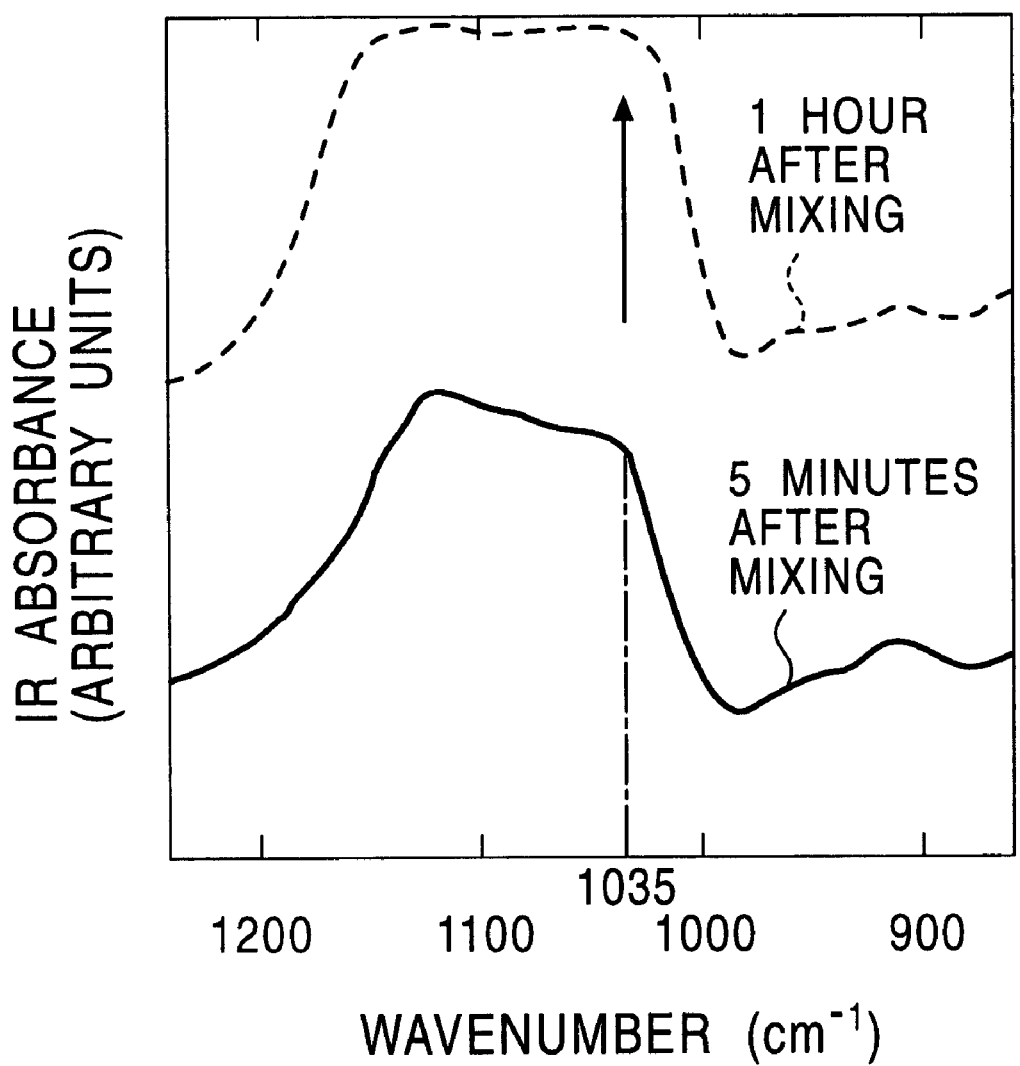
FIG. 4 shows infrared absorption spectra for measuring the degree of gelation of a stock solution.

FIG. 4 shows infrared spectra of a mixed stock solution at 5 minutes and 1 hour after a 30-g tetraethoxysilane (Si(C$_2$H$_5$O)$_4$) in ethanol solution (silane alkoxide solution) and a 1-g ammonia in 100-g water solution (gelation initiator solution) are mixed. The abscissa indicates the wavenumber and the ordinate indicates the absorbance. The solid line indicates the spectrum at 5 minutes and the broken line indicates the spectrum at 1 hour. The alkoxide solution is hydrolyzed by the effect of the gelation initiator solution to form silanetetraol and then the silanetetraol yields Si—O—Si crosslinks by condensation. The absorbance near 1,035 cm$^{-1}$ increases from 50% at 5 minutes to 98% at 1 hour, as shown by an arrow in FIG. 4. Herein, the absorbance is a relative value with respect to the absorbance (100%) of a sample, which is sufficiently gelated, at 6 hours after the mixing. As the gelation proceeds, the absorbance near 1,035 cm$^{-1}$ due to the Si—O—Si bonds increases. Thus, the absorbance indicates the degree of gelation.

Figure 5:
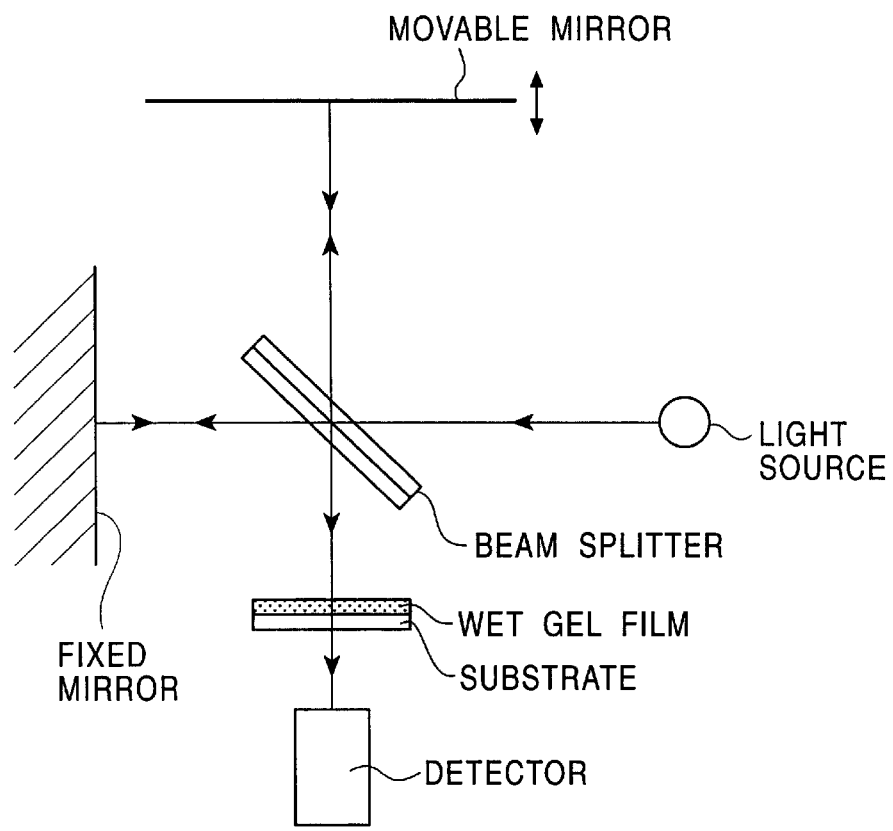
FIG. 5 is a schematic view of a method for measuring the degree of gelation of a wet-gel film by light absorption.

The degree of gelation of a wet-gel film formed on a substrate is determined, for example, by an apparatus shown in FIG. 5. The basic configuration of this apparatus is the same as that of the apparatus shown in FIG. 3. The degree of gelation is determined by the absorbance at 1,035 cm$^{-1}$ as in the stock solution.

(2) Measurement of Degree of Gelation by Viscosity

This method is primarily applied to the measurement of the degree of gelation of a stock solution. As the gelation of the stock solution proceeds, the viscosity of the stock solution increases.

Figure 6:
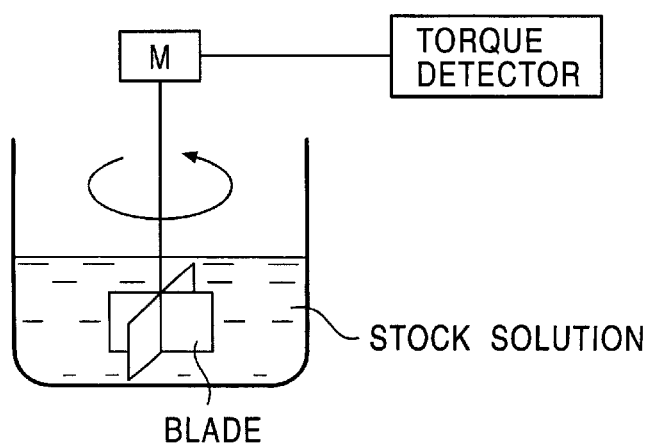
FIG. 6 shows a method for measuring the degree of gelation of a stock solution by the viscosity.

The method for measuring the viscosity is not limited. FIG. 6 shows a method for measuring the viscosity. In this method, the torque of a stirrer immersed in the stock solution is measured to determine the viscosity. The stirrer with blades is rotated at a constant speed. The torque increases in response to the viscosity of the stock solution, and the increased torque is detected as an increased current in a motor.

Figure 7:
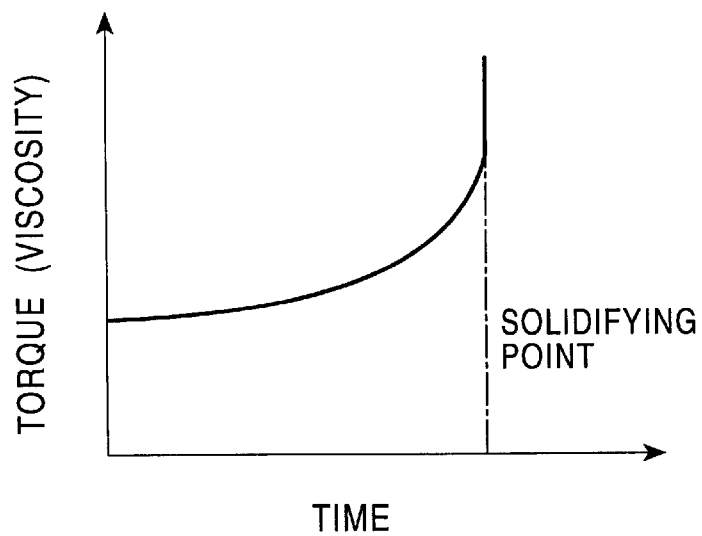
FIG. 7 is a graph of the relationship between the torque (viscosity) and the time for measuring the degree of gelation.

For example, FIG. 7 is a graph of a torque over time of a mixture of a tetraalkoxysilane in ethanol solution as an alkoxide solution and an aqueous ammonia solution as a gelation initiator solution. The abscissa indicates the elapsed time from the mixing or the initiation of the gelation, and the ordinate indicates the torque. FIG. 7 shows that the torque increases gradually as the gelation proceeds over time and steeply at a solidifying point which indicates the final stage of the gelation.

Method for Making Aerogel Film

In a method for making the aerogel film in accordance with the present invention, a gelation reaction of a metal alkoxide is allowed to occur on a substrate to prepare a wet-gel-film-substrate, and the wet-gel-film-substrate is subjected to a supercritical or sub-critical drying process when the degree of gelation of the wet-gel film on the wet-gel-film-substrate reaches a predetermined value G.

Figure 1A:
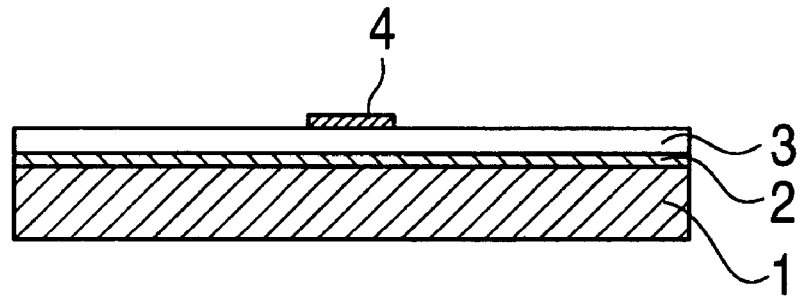
FIGS. 1A and 1B are cross-sectional views of configurations of microstrip substrates.
Figure 1B:
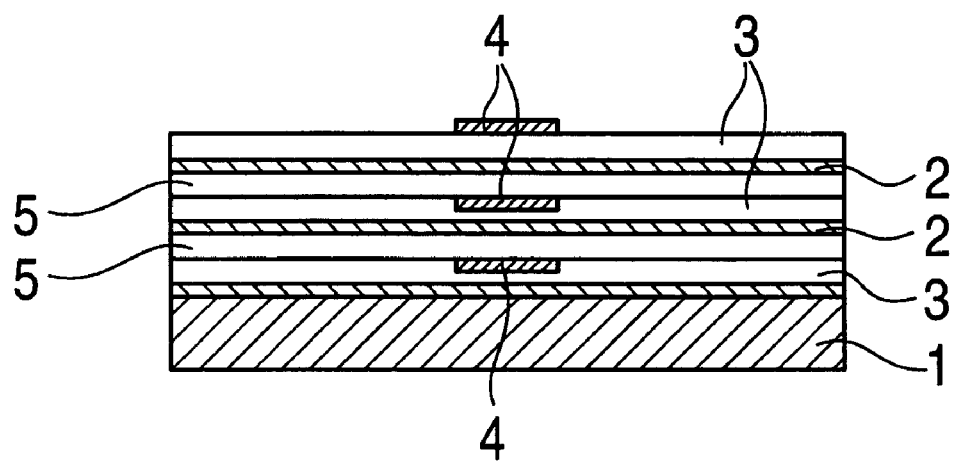
Figure 2:
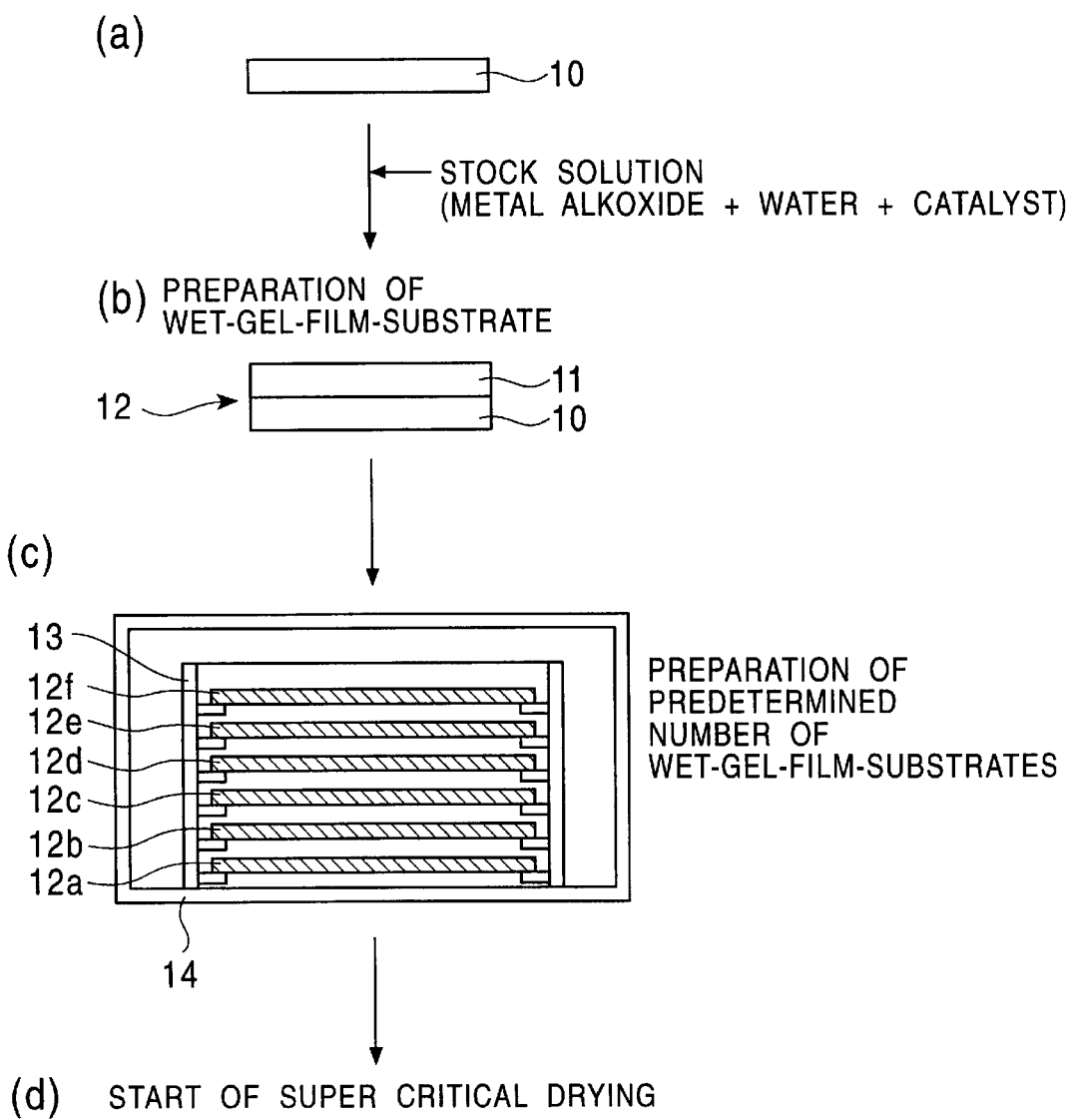
FIGS. 2A to 2D show a method for making an aerogel film.

When a plurality of aerogel films is efficiently produced, as shown in FIG. 2, each stock solution composed of a metal alkoxide, water, and a catalyst is applied onto each substrate 10 to prepare a wet-gel-film-substrate 12 and the wet-gel-film-substrate 12 is placed into a holder 13. A predetermined number of wet-gel-film-substrates 12a, 12b, . . . , 12f is placed into the holder 13 in such a manner. When the degrees of gelation of these wet-gel-film-substrates 12a, 12b, . . . , 12f reach substantially the same level G, these wet-gel-film-substrates are simultaneously subjected to a supercritical or sub-critical drying process. The degree of gelation is determined by one of the above methods.

In the production of the aerogel film of the present invention, the degree of the formed wet-gel film is controlled to the predetermined value at the start of the supercritical or sub-critical drying process according to the following two methods. A first method includes suppression of the gelation reaction in the wet-gel film and then cessation of the suppression or acceleration of the gelation reaction. A second method includes adjustment of the gelation reaction rate in response to the holding time from the start of the gelation reaction to the supercritical or sub-critical drying process. A case of high-efficiency production of a plurality of aerogel films based on the first and second methods will now be described. First Method for Controlling the Degree of Gelation As described above, in the first method, the gelation reaction of each wet-gel film is suppressed when this wet-gel film is formed on the corresponding substrate. After a predetermined number of wet-gel-film-substrates are prepared, the gelation reaction is released from the suppression or is accelerated so that the degrees of gelation of these wet-gel films reach substantially the same level, that is, the predetermined value.

The gelation reaction can be suppressed by (a) maintaining the wet-gel-film-substrates at a low temperature, or by (b) mixing an additive for suppressing the gelation (hereinafter referred to as a "gelation retarder") into the reaction system.

In the method (a), the condensation represented by the equation (2) is retarded at low temperatures. In general, the holder 13 is maintained at a low temperature in order to maintain the wet-gel-film-substrates 12 at a low temperature.

In the method (b), an organic acid, such as formic acid or acetic acid, is added as the gelation retarder to the reaction system containing the metal alkoxide and water (gelation initiator) in order to suppress the gelation. The carboxyl group of the organic acid coordinates with a hydroxy group of the silanetetraol by hydrogen bonding and inhibits condensation of the silanetetraol molecules represented by the equation (2).

These methods (a) and (b) can suppress the gelation reaction of the wet-gel films before the predetermined number of wet-gel-film-substrates 12a, 12b, . . . , 12f are prepared and placed in the holder 13. When all the wet-gel-film-substrates are prepared, the gelation reaction is released from suppression or is accelerated.

In the method (a), these wet-gel-film-substrates are simultaneously heated by heating the holder 13 to accelerate the gelation reaction.

In the method (b), the effects of the gelation retarder are eliminated so that free hydroxyl groups appear in the silanetetraol molecules. That is, the wet-gel-film-substrates are heated or irradiated with electromagnetic waves such as ultraviolet rays to dissociate or decompose the carboxyl groups. When the method (2) is achieved by heat, the wet-gel-film-substrates may be maintained at such an elevated temperature or may be cooled to room temperature after the completion of the gelation reaction. Electromagnetic wave irradiation is preferable since this does not involve a temperature rise in the holder 13 and does not cause an extremely rapid gelation reaction. Thus, the resulting aerogel film has a dense network structure. The gelation reaction rates are substantially the same with respect to the wet-gel-film-substrates during the method (b).

As described above, in the first method for controlling the degree of gelation, the gelation reaction is suppressed before the predetermined number of wet-gel-film-substrates is prepared, and is then released from the suppression or is accelerated so that the degrees of gelation of these wet-gel films are substantially the same at the start of the supercritical or sub-critical drying process.

Figure 8:
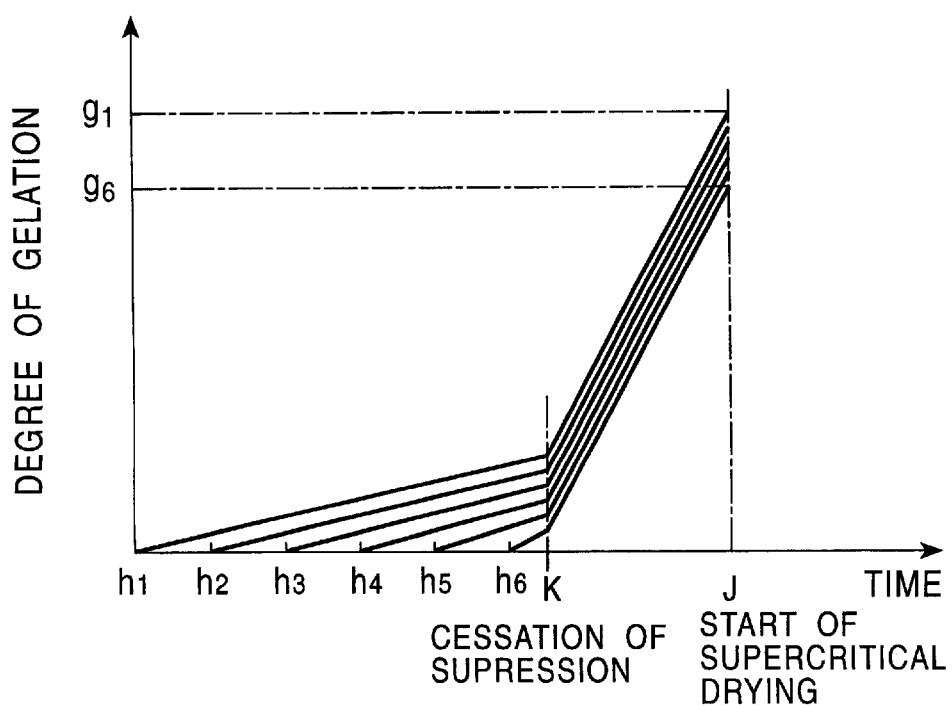
FIG. 8 is a graph of the relationship between the degree of gelation and the time elapsed from the start of the gelation for illustrating a first method for controlling the degree of gelation.

With reference to FIG. 8, for example, six wet-gel-film-substrates are prepared and are placed in the holder at times $h_1$, $h_2$, . . . , $h_6$ to suppress the gelation reaction. When the sixth wet-gel-film-substrate is placed in the holder at time K, the gelation reaction is released from the suppression or is accelerated. The gelation reaction proceeds slowly before time K and rapidly after time K. The wet-gel-film-substrates are subjected to the supercritical or sub-critical drying process starting at time J, wherein there is no significant difference between the degree of gelation $g_1$ of the first wet-gel-film-substrate 12a and the degree of gelation $g_6$ the sixth wet-gel-film-substrate 12f at the start of the supercritical or sub-critical drying process. Thus, the resulting aerogel films have substantially the same degree of gelation G and the same porosity after the supercritical or sub-critical drying process whatever the time J is determined based on any one of the wet-gel-film-substrates. As a result, the aerogel films have substantially the same dielectric constants.

The time J may be determined by monitoring whether or not the degree of gelation of a base wet-gel-film-substrate, for example, the first wet-gel-film-substrate, reaches the predetermined value G. When the gelation reaction rate is known after time K, the time J can be calculated from the gelation reaction rate.

When aerogel films are independently produced, the gelation reaction of each wet-gel-film-substrate is suppressed before the supercritical or sub-critical drying process is ready to be executed. When the degree of gelation of each wet-gel-film-substrate reaches the predetermined value G, the gelation reaction is released from the suppression and is accelerated. The value G is determined so that the dielectric constant and the loss of the resulting aerogel film is minimized. The suppression of the gelation reaction can be achieved by the above method (a) or (b).

Second Method for Controlling the Degree of Gelation

In the second method for controlling the degree of gelation, the gelation reaction rates are controlled in response to the elapsed times of the wet-gel-film-substrates from the start of the gelation reaction to the start of the supercritical or sub-critical drying process. When a plurality of aerogel films are produced with high efficiency, the gelation reaction rates of the wet-gel-film-substrates which are sequentially produced are controlled so that the degrees of gelation of the wet-gel films are substantially the same at the start J of the supercritical or sub-critical drying process. The gelation reaction rate of each wet-gel film is determined based on the time (J–S) from the start S of the gelation reaction to the start J of the supercritical or sub-critical drying process. Thus, the reaction rate of the first wet-gel-film-substrate is set to be the lowest and those of the subsequent wet-gel-film-substrates are set to be gradually increased.

The gelation reaction rates can be controlled using a gelation promoter which accelerates the reaction and/or a gelation retarder which suppress the reaction.

Typical gelation retarders are organic acids, such as formic acid or acetic acid, as described in the first method. The gelation promoters may be compounds which accelerate hydrolysis of the metal alkoxide, represented by the equation (1), or compounds which accelerate condensation of the silanetetraol molecules, represented by the equation (2). Examples of the former compounds include acids, such as hydrochloric acid, which can decrease the pH value of the reaction system to 4 or less. Examples of the latter compounds include bases, such as ammonia, which can increase the pH value of the reaction system to 10 or more. The gelation reaction rate increases with the concentration of the accelerator. Since these gelation promoters and gelation retarders are soluble in water as the gelation initiator, they are used in an aqueous solution. Thus, the gelation reaction rate can be controlled by changing the composition of the gelation initiator solution (types and concentrations of the gelation promoter and/or gelation retarder) or by changing the composition of the stock solution as a mixture of the gelation initiator solution and a metal alkoxide.

The types and the amounts of the gelation promoter and/or the gelation retarder may be appropriately selected based on data on the relationship between the amount and the degree of gelation over an elapsed time. That is, the types and the amounts of the gelation promoter and/or the gelation retarder may be determined based on the gelation reaction rate of the reagent in view of the holding time from the start S of the gelation reaction (when the metal alkoxide and the gelation initiator solution are mixed) to the start J of the supercritical or sub-critical drying process.

Figure 9:
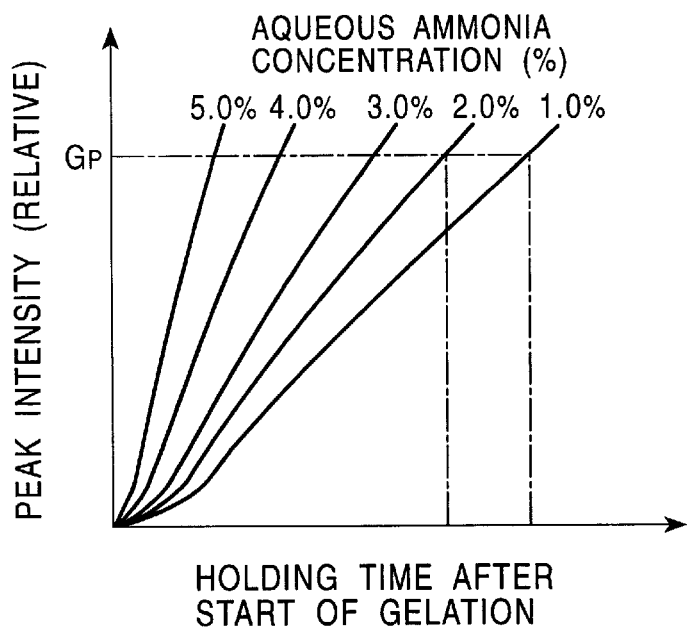
FIG. 9 is a graph for illustrating a second method for controlling the degree of gelation.
Figure 10:
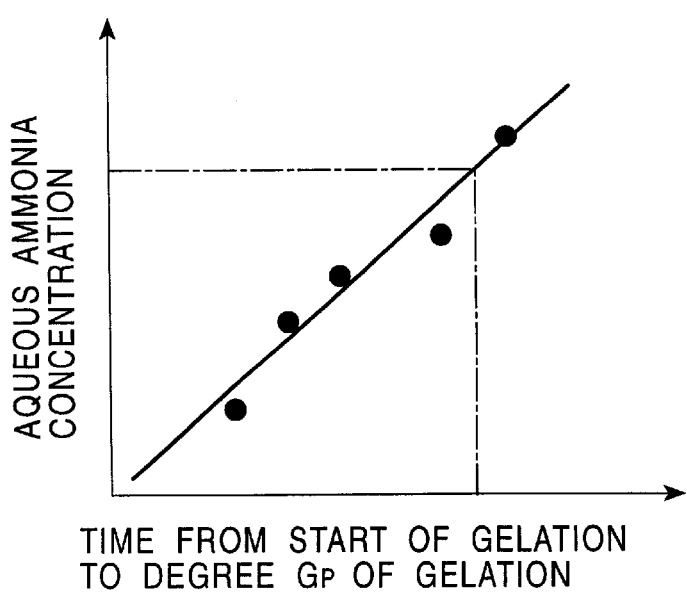
FIG. 10 is a graph of the relationship between the concentration of a gelation promoter and the time from the start of the gelation to a predetermined degree of gelation.

For example, FIG. 9 is a graph of the relationship between the degree of gelation and the holding time from the start of the gelation reaction of a mixture of a tetramethoxysilane in ethanol solution and an aqueous ammonia as a gelation promoter. The ordinate represents the absorbance at 1,035 $cm^{-1}$ which reflects the degree of gelation. FIG. 9 suggests that as the concentration of ammonia is increased, gelation is promoted. After the absorbance Gp corresponding to the degree of gelation G at the start of the supercritical or sub-critical drying process is determined, the holding time until the absorbance of each ammonia concentration reaches the predetermined value Gp is determined (hereinafter this holding time is referred to as the "gelation time"). FIG. 10 is a graph of the relationship between the ammonia concentration and the gelation time. FIG. 10 suggests that the gelation time is proportional to the ammonia concentration.

Thus, the concentration of the gelation promoter (ammonia) in the reaction system can be determined based on the holding time t at the predetermined degree of gelation G (or Gp). Use of gelation initiator solutions or stock solutions having different compositions for different substrates can maintain the degrees of gelation to the predetermined value G at the start J of the supercritical or sub-critical drying process regardless of different holding or gelation times t for the substrates.

When a plurality of wet-gel films are formed on substrates over a predetermined time interval, the time Si of the i-th substrate at the start of the gelation reaction is determined (wherein the letter "i" represents the order of production of the wet-gel-film-substrate). After the ammonia concentration for the first wet-gel-film-substrate and the degree of gelation G before the supercritical or sub-critical drying process are determined, the time J of the first wet-gel-film-substrate at the start of the gelation reaction is determined. Thus, the time from the start Si of the gelation reaction to the time when the i-th wet-gel film reaches the degree of gelation G is represented by J–Si. The ammonia concentration is determined so that the degree of gelation of the i-th wet-gel film reaches the predetermined value G for the time (J–Si).

Figure 11:
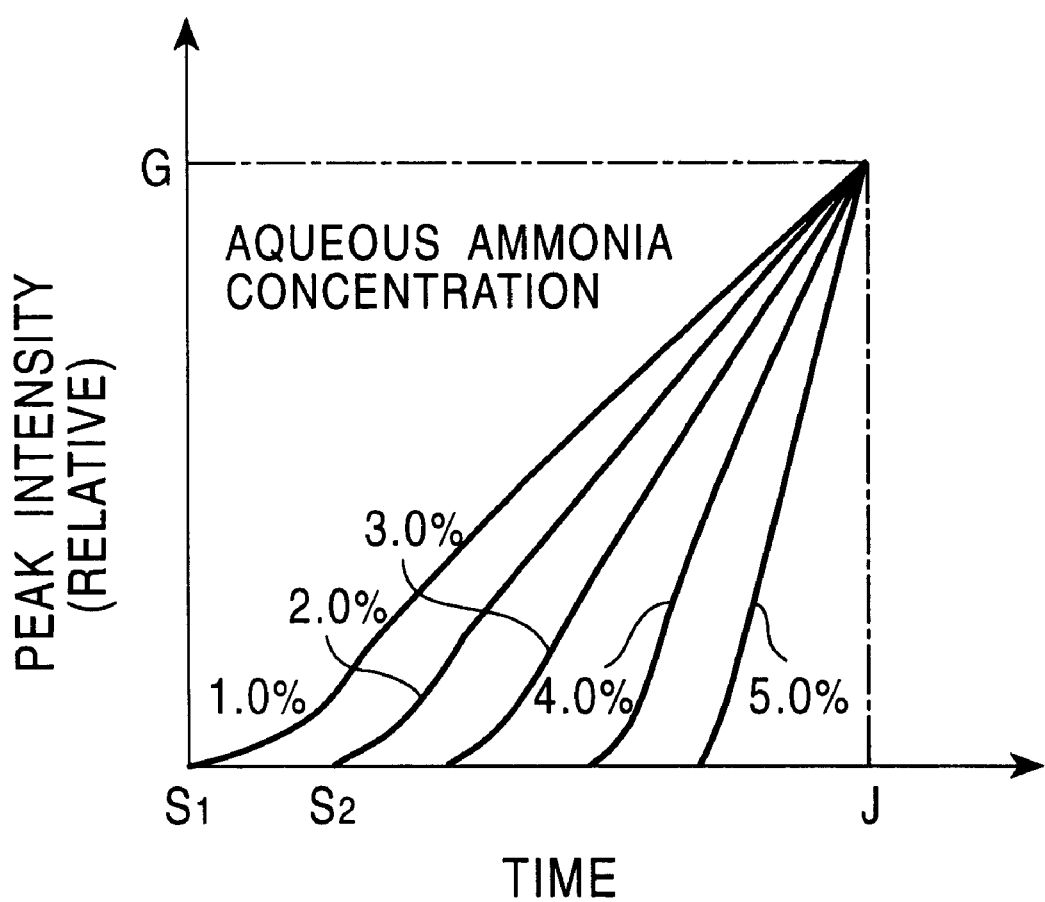
FIG. 11 is a graph for illustrating a second method for controlling the degree of gelation.

FIG. 11 shows the ammonia concentrations for wet-gel-film-substrates having different holding times from the start of the gelation reaction to the start of the supercritical or sub-critical drying process, in which the ordinate represents the infrared absorbance corresponding to the degree of gelation. The wet-gel-film-substrate formed later has a higher ammonia concentration so that all the wet-gel-film-substrates have substantially the same degree of gelation G at the start J of the supercritical or sub-critical drying process, in which the degree of gelation G is determined by the first substrate $S_1$.

Regarding any other gelation promoter, such as hydrochloric acid, other than ammonia, the concentration of the gelation promoter for each wet-gel-film-substrate can be determined based on the relationship between the concentration and the holding time. The gelation promoter and the gelation retarder may be used in combination. In such a case, the relationship between the types and the concentrations of these reagents and the holding time (gelation time) for the predetermined degree of gelation is preliminarily determined, as in the ammonia solution.

When the holding time (J–Si) of the i-th wet-gel-film-substrate is determined, the types and the concentrations of the gelation promoter and/or the gelation retarder in the gelation initiator solution can be determined according to the holding time.

Figure 12:
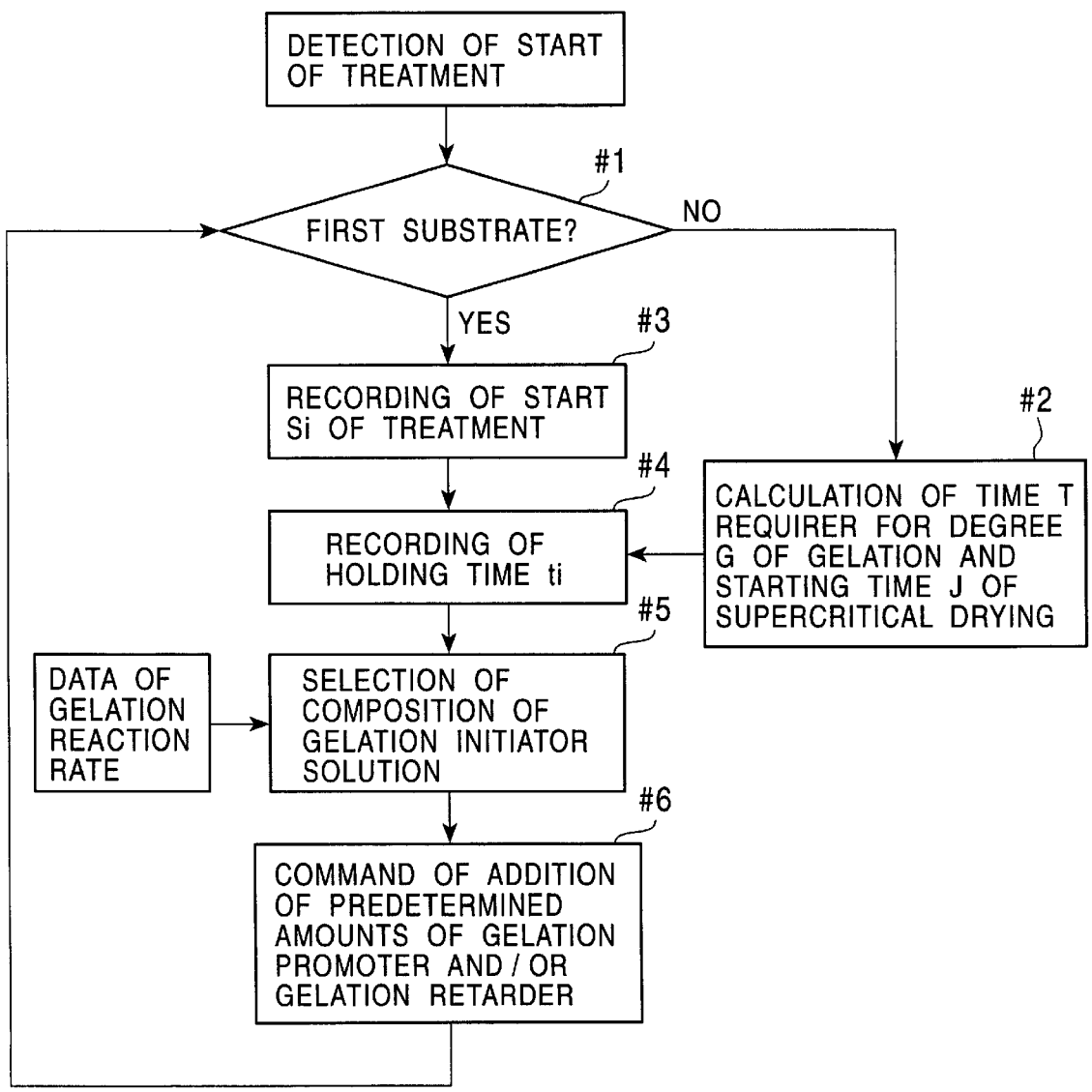
FIG. 12 is a flow chart for controlling the amount of a gelation promoter used in a second method for controlling the degree of gelation.

When the holding time (j–Si) of the i-th wet-gel-film-substrate is not determined, the second method for controlling the degree of gelation can be achieved by selecting the composition of the gelation initiator solution or the stock solution for each substrate, based on a flow chart shown in FIG. 12. In Step 1, it is determined whether or not a first substrate is subjected to coating. If the first substrate is coated, Step 2 calculates the time T at which the degree of gelation reaches the predetermined value G and the start J of the supercritical or sub-critical drying process. If a substrate other than the first substrate is subjected to coating, Step 3 records the initial time Si of the gelation, and Step 4 calculates the holding time $t_i$ (=J−Si) from the start Si of the gelation reaction to the start J of the supercritical or sub-critical drying process of the wet-gel-film-substrate based on the time T calculated in step 2, wherein the letter "i" represents the order of the treatment of the substrate. Step 5 determines the composition of the gelation initiator solution or the stock solution (for example, the concentration of the aqueous ammonia solution when the gelation promoter is ammonia) based on the data of the composition of the gelation promoter and/or the gelation retarder and the gelation reaction rate so that the degree of gelation reaches the predetermined value G at the time $T_i$. Step 6 directs the amount of the ammonia promoter to prepare a gelation initiator solution or a stock solution having a desired composition. In such a method, the start J of the supercritical or sub-critical drying process can be determined for one lot of wet-gel-film-substrates. Moreover, the gelation initiator solution can be prepared for each substrate.

When an aerogel film is formed alone, the time t from coating of a wet-gel film on a substrate to the degree of gelation having a predetermined value is determined by the composition of the stock solution. Thus, the start J of the supercritical or sub-critical drying process can be determined according to the composition. In contrast, the composition of the stock solution or the gelation initiator solution can be determined from the start J of the supercritical or sub-critical drying process based on the data on the gelation reaction rate.

Method for Making Wet-gel-film-substrate

A process for making the wet-gel-film-substrate will now be described. The wet-gel-film-substrate is formed by supplying a metal alkoxide, water as an initiator of the gelation reaction, a gelation promoter and/or a gelation retarder, if necessary, onto a rotating substrate.

Supply of these materials may be performed by the following methods. The metal alkoxide and water as the gelation initiator may be separately supplied onto the substrate so as to be mixed on the substrate (method (1)). Alternatively, a stock solution of the metal alkoxide and water may be supplied onto the substrate (method (2)).

When the stock solution is used, the gelation promoter and/or the gelation retarder can be contained in the stock solution to practice the first or second method for controlling the degree of gelation. When the metal alkoxide and water is separately supplied, the gelation promoter and/or the gelation retarder may be contained in water. In other words, an aqueous gelation promoter solution and/or an aqueous gelation retarder solution may be used.

In method (1), the gelation reaction starts when the raw materials are mixed. Thus, the first method and the second method for controlling the degree of gelation can be employed. In order to adjust the thickness of the metal alkoxide to be applied, a viscosity modifier can be added to the metal alkoxide. The viscosity modifier can modify the viscosity of the metal alkoxide. A preferred viscosity modifier is a mixture of polyethylene glycol (PEG) and ethanol. Other materials which have an adequate viscosity and are miscible with both water and alcohol can also be used. Examples of such materials include polyvinyl alcohol (PVA) and polypropylene glycol (PPG).

In the mixing on the substrate, the metal alkoxide and the gelation initiator may be simultaneously supplied onto the substrate. Alternatively, the metal alkoxide and then the gelation initiator may be supplied onto the substrate. The gelation reaction starts when the metal alkoxide and water are mixed on the substrate. These materials are generally supplied as solutions. When a volatile material such as ammonia is used, the material may be supplied as gas. For example, the substrate on which the metal alkoxide and water are applied is placed into a hermetically sealed container and then the hermetically sealed container is filled with gas such as ammonia. The gas dissolves into the metal alkoxide film formed on the substrate via the contact interface between the metal alkoxide and the gas, resulting in promotion or suppression of the gelation reaction.

In method (2), the stock solution is supplied onto the substrate. Stock solutions may be prepared for individual substrates to be treated. Alternatively, stock solutions may be prepared for one lot of substrates which are subjected to simultaneous supercritical or sub-critical drying.

In a combination of the first method for controlling the degree of gelation and method (2), a stock solution may be prepared for each substrate or for each lot. When the stock solution is prepared for each lot, the holding time of the stock solution for a wet-gel film formed later is larger than that for a wet-gel film which is formed earlier. Since the gelation reaction, however, slowly proceeds before the time K of the cessation of the suppression, there is no significant difference in the degree of gelation at the time K.

In a combination of the second method for controlling the degree of gelation and method (2), stock solutions are prepared for individual substrates so that the gelation reaction rate of each substrate is determined in response to the order of the formation of the wet-gel film, that is, the holding time before the supercritical or sub-critical drying process. If the stock solutions in which the gelation reaction is not suppressed are prepared, the viscosity of the stock solution increases during the coating process due to the gelation reaction. Thus, the thickness of the wet-gel film formed later will increase when the stock solution is applied onto the substrates rotating at a constant rotation rate. For example, when a stock solution of 30 g of tetramethoxysilane, 70 g of ethanol, 14 g of water, and 0.1 g of 30% ammonia is applied onto substrates rotating at a constant rotation rate, wet-gel films having different thicknesses are formed depending on the time elapsed after the preparation of the stock solution due to different degrees of gelation, which are indicated by the infrared absorbances (%), as shown in Table 1.

TABLE 1

| Elapsed Time after Gelation | 10 minutes | 1 hour | 2 hours |
| --- | --- | --- | --- |
| IR Absorbance (%) | 50 | 82 | 98 |
| Thickness (μm) | 0.5 | 1.5 | 5 |

In the second method for controlling the degree of gelation, a stock solution may be prepared for one lot of the substrates when the rotation of each substrate is controlled in response to the viscosity of the stock solution in order to maintain the thickness of the formed wet-gel film constant. In this case, the degree of gelation is measured according to the above-described method and the rotation rate of the substrate is calculated based on the preliminarily determined relationship between the degree of gelation (viscosity or IR absorbance), the rotation rate of the substrate, and the thickness.

In this case, it is preferable that the reservoir containing the stock solution be maintained at a low temperature to suppress the gelation reaction in the stock solution so as not to preclude the supply of the stock solution for the last substrate. It is preferable that the composition of the stock solution be determined so that the viscosity of the stock solution is not very high when the stock solution is applied onto the last substrate.

Apparatus for Making Aerogel Film

An apparatus for making the aerogel film in accordance with the present invention will be described.

Figure 13:
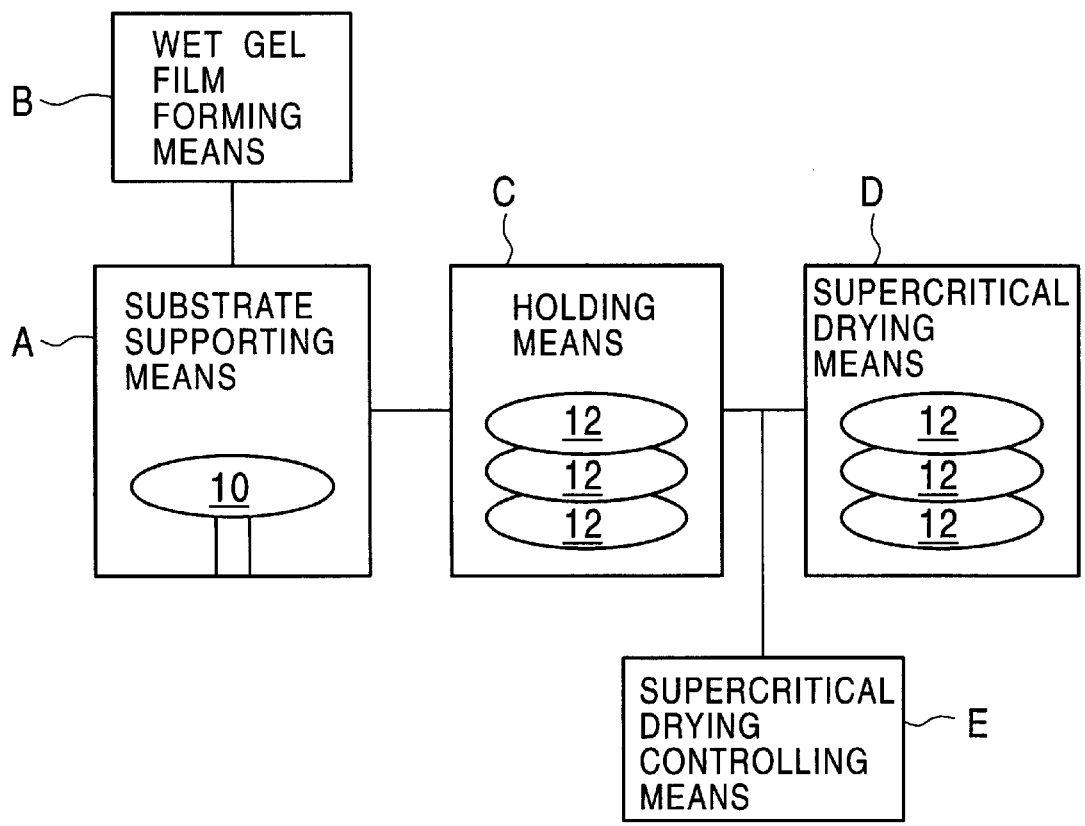
FIG. 13 is a block diagram of a basic configuration of an apparatus for making aerogel films of the present invention.

With reference to FIG. 13, the basic structure of the apparatus for making the aerogel film includes:

substrate supporting means A for supporting a substrate, wet-gel film forming means B for forming a wet-gel film on the substrate supported by the substrate supporting means, holding means C for holding a plurality of substrates with wet-gel films, supercritical or sub-critical drying means D for drying the plurality of substrates with wet-gel films held in the holding means in a supercritical or sub-critical medium, and supercritical or sub-critical drying control means E for initiating the supercritical or sub-critical drying by the supercritical or sub-critical drying means when the degree of gelation of the wet-gel films on the substrates held in the holding means reaches a predetermined value.

Each means will be described below.

Substrate supporting means A

Any substrate supporting means which can support a disk substrate may be used. Preferably, the substrate supporting means has a turntable and a rotation mechanism which can fix and rotate the substrate so that a stock solution containing a metal alkoxide can be spin coated on the substrate to form a wet-gel film.

The turntable preferably fixes the substrate by vacuum chucking and is preferably contained in a hermetically sealed container in order to prevent evaporation of volatile components such as alcohol in the stock solution supplied onto the substrate. When a gaseous gelation promoter and/or a gaseous gelation retarder are used during the formation of a wet-gel film, the hermetically sealed container is filled with these gaseous materials. The hermetically sealed container is preferably provided with a ventilation means.

The rotation mechanism may be an actuator such as a motor. When the second method for controlling the degree of gelation is employed using a stock solution for one lot, the rotation rate of the turntable is determined for each substrate. Thus, the rotation mechanism is preferably provided with gelation measuring means which measures the degree of gelation of the stock solution and rotation controlling means which controls the rotation rate of the substrate in response to the measured degree of gelation.

The gelation measuring means may be an apparatus for measuring the degree of gelation by a change in light scattering or viscosity, as described above. The rotation controlling means may have a calculating unit which calculates the rotation rate depending on the degree of gelation output form the gelation measuring means and a rotation controlling unit which controls the rotation of the rotation mechanism based on the calculation.

When the second method for controlling the degree of gelation is employed and when the type and the amount of the gelation promoter are determined based on the order of treatment of the substrate, the substrate supporting means is preferably provided with detecting means and composition selecting means which perform the control shown in FIG. 12. The detecting means has a counter for determining whether or not the substrate is a first substrate and a timer for recording the times when materials for forming the wet-gel film are supplied onto the rotating substrate. The materials may be supplied as a stock solution or be separately supplied as a metal alkoxide and a gelation initiator solution. The composition selecting means determines the amount of the gelation promoter based on the data on the time obtained by the detecting means and on the concentration and the reaction rate of the gelation promoter. The results determined by the composition selecting means is input to the wet-gel film forming means (in particular, a composition controlling means described below) to determine the composition of the solution (the stock solution or the gelation initiator solution) containing the gelation promoter.

The substrate supporting means may be of a type which can support a plurality of substrates. In such a case, the rotation mechanism may rotate all the substrates, or may rotate only one substrate.

Wet-gel film Forming Means B

The wet-gel film forming means supplies a metal alkoxide (a solution containing a silicon alkoxide monomer or oligomer), water as a gelation initiator, and optionally a gelation promoter and/or a gelation retarder onto the substrate supported by the substrate supporting means, in predetermined amounts, to form a wet-gel film. There are two types of wet-gel film forming means. A first type supplies onto the substrate a stock solution of the metal alkoxide, water, the gelation promoter and/or the gelation retarder in which the gelation reaction has already started. A second type separately supplies onto the substrate the metal alkoxide, water as the gelation initiator, and the gelation promoter and/or the gelation retarder (hereinafter the mixture of water and the gelation promoter and/or the gelation retarder is referred to as a gelation initiator solution") from different containers so that the gelation reaction starts on the substrate.

First Type for Supplying Stock Solution

The first type of the wet-gel film forming means has a stock solution reservoir containing the stock solution and stock solution supplying means for supplying a predetermined stock solution onto the substrate. The stock solution supplying means may be a drip nozzle which ejects a predetermined amount of stock solution onto the substrate by a pump or may be a spray nozzle which spray-coats a predetermined amount of stock solution onto the substrate.

The stock solution reservoir may contain stock solutions which are prepared for individual substrates or a stock solution for one lot of substrates which are simultaneously subjected to a supercritical or sub-critical drying process.

A combination of the first type of the wet-gel film forming means and the first method for controlling the degree of gelation enables use of stock solutions which are prepared for individual substrates and a stock solution which is prepared for one lot of substrates. Since the gelation reaction of the stock solution is suppressed in the reservoir in the first method for controlling the degree of gelation, there is no substantial difference between the degrees of gelation of wet-gel films when the wet-gel films are formed on the substrates.

When the first type of the wet-gel film forming means is combined with the second method for controlling the degree of gelation and when the substrate is rotated at a constant rotation rate or is not rotated, stock solutions having required gelation reaction rates are prepared for individual substrates. Thus, the stock solution reservoir preferably has first composition controlling means for controlling the composition of each stock solution. That is, the first composition controlling means includes a metal alkoxide reservoir and a gelation initiator reservoir containing water and a gelation promoter and/or a gelation retarder and determines the types and the concentrations of the gelation promoter and/or the gelation retarder and the amounts of these raw materials so that the required gelation reaction rate can be achieved for each substrate.

The types and the concentrations of the gelation promoter and/or the gelation retarder are determined based on the data of the relationship between the types and the concentrations of the gelation promoter and/or the gelation retarder and the reaction rate. When the first composition controlling means is provided, a stock solution having a composition suitable for a holding time of a substrate is contained in the stock solution reservoir and is supplied from the stock solution supplying means. The reaction rate can thereby be controlled for each substrate.

When the second method for controlling the degree of gelation is employed and when a stock solution is prepared for one lot of stock solution, the rotation rates of individual substrates are controlled in response to the degree of gelation of the stock solution in order to form wet-gel films having the same thickness on these substrates regardless of the order of treatment of the substrates.

Thus, the degree of gelation of the stock solution in the stock solution reservoir is measured by the gelation measuring means of the substrate supporting means. The measured degree of gelation is converted into electrical signals and is input to the rotation controlling means. The stock solution in the stock solution reservoir is supplied onto the substrate which rotates at a rotation rate calculated from the degree of gelation by the stock solution supplying means.

Figure 14:
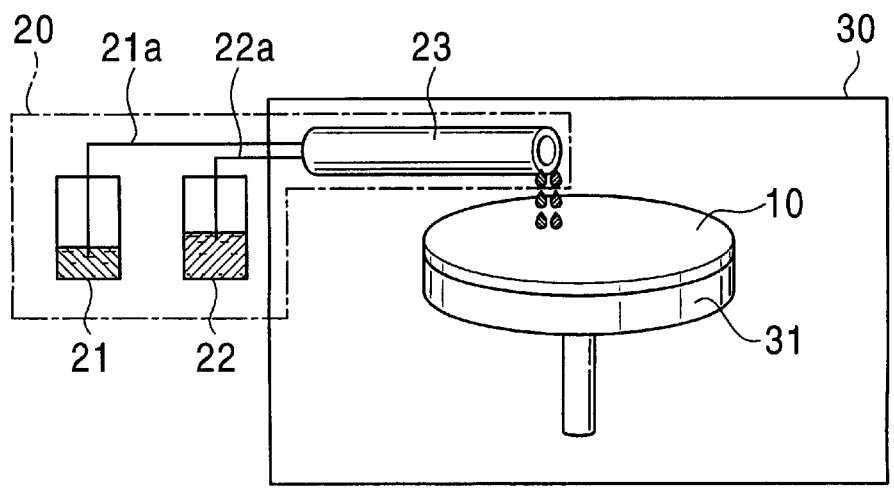
FIG. 14 is a schematic view of an embodiment of wet-gel film forming means.
Figure 15:
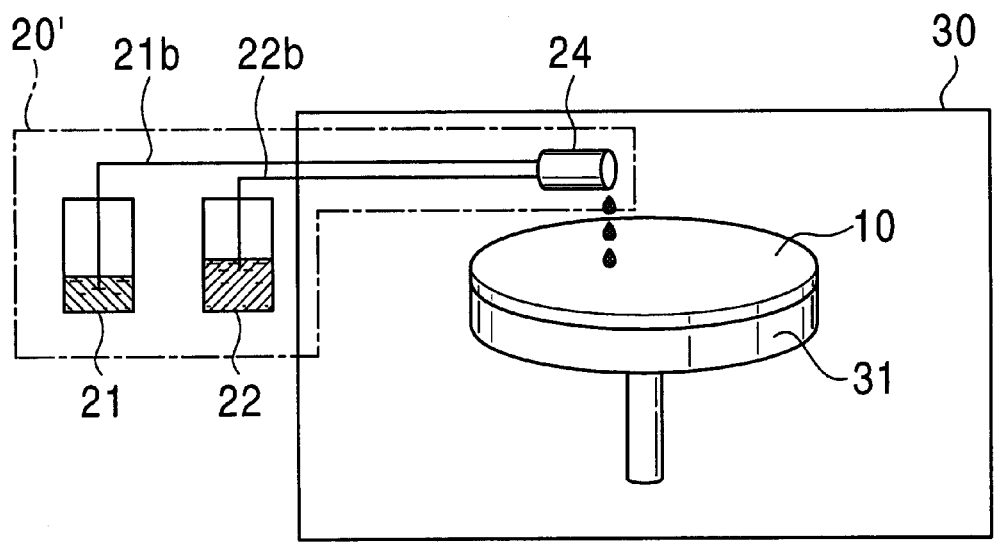
FIG. 15 is a schematic view of another embodiment of wet-gel film forming means.
Figure 16:
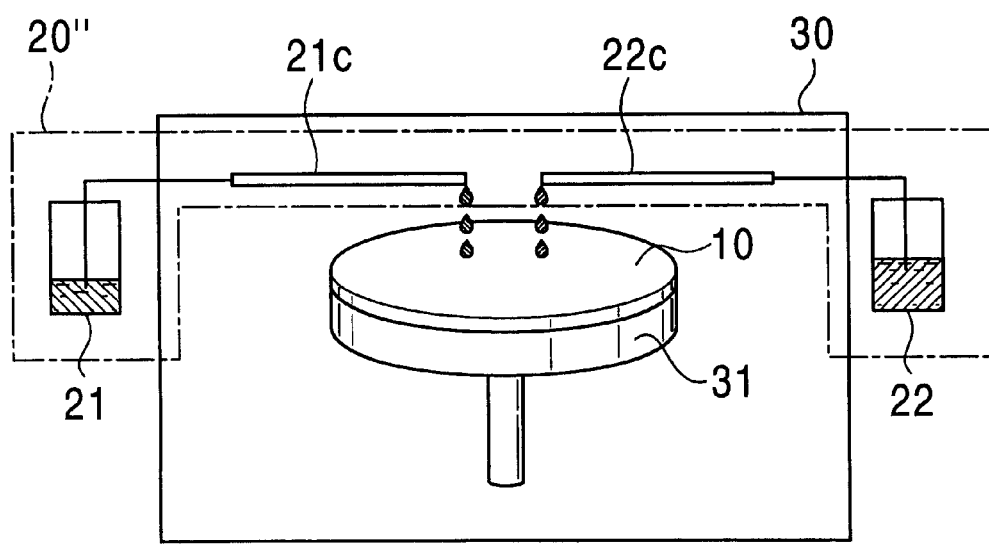
FIG. 16 is a schematic view of another embodiment of wet-gel film forming means.

Second Type for Separately Supplying Metal Alkoxide and Gelation Initiator Solution The second type of the wet-gel film forming means has a first reservoir for a metal alkoxide, a second reservoir for a gelation initiator solution, and supply means for supplying these solutions onto a substrate supported on the substrate supporting means, as shown in FIGS. 14 to 16.

A wet-gel film forming means 20 shown in FIG. 14 includes a first reservoir 21 for the metal alkoxide, a second reservoir 22 for the gelation initiator solution, and a coaxial nozzle 23. Pipes 21a and 22a are provided between the first and second reservoirs 21 and 22, respectively, and the coaxial nozzle 23. Both the metal alkoxide and the gelation initiator solution are ejected through the coaxial nozzle 23 on a substrate 10 supported on a turntable of a substrate supporting means 30.

A wet-gel film forming means 20' shown in FIG. 15 includes the first reservoir 21 for the metal alkoxide, the second reservoir 22 for the gelation initiator solution, and a mixing nozzle 24. Pipes 21b and 22b are provided between the first and second reservoirs 21 and 22, respectively, and the mixing nozzle 24, and are integrated in the mixing nozzle 24. The metal alkoxide and the gelation initiator solution are mixed in the mixing nozzle 24. Thus, strictly speaking, the gelation does not start on the substrate 10. However, the time interval from the mixing time in the mixing nozzle 24 to the time when the solution is supplied onto the substrate is very brief. Thus, the gelation time is considered to be substantially equal to the time when the solution is supplied onto the substrate. This wet-gel film forming means 20' is preferably used when the volumes of the metal alkoxide and the gelation initiator solution are different, because the reservoirs 21 and 22 and the mixing nozzle 24 are connected by the pipes 21b and 22b.

Figure 17A:
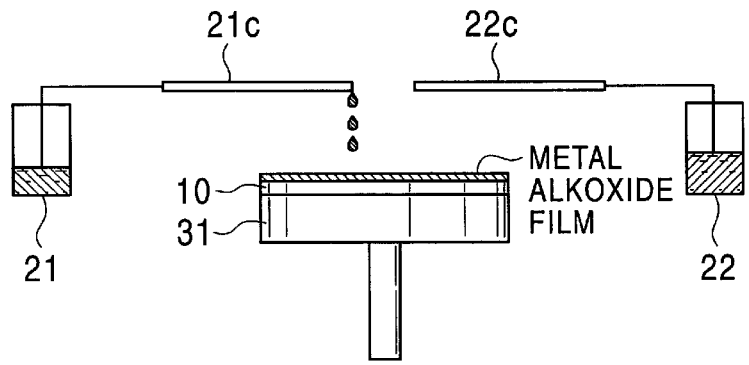
FIGS. 17A and 17B are schematic views for illustrating other methods using the wet-gel film forming means shown in FIG. 16.
Figure 17B:
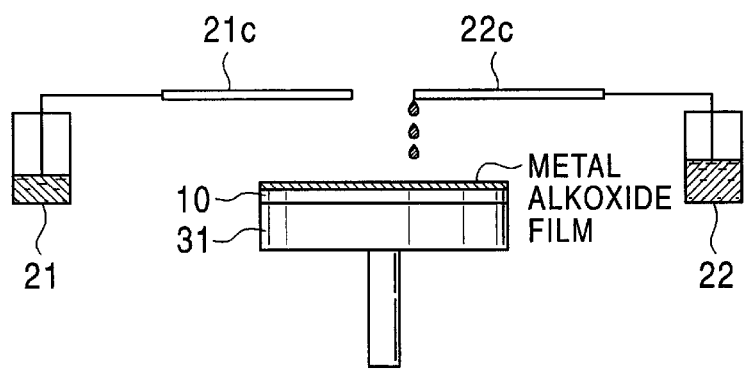

A wet-gel film forming means 20" shown in FIG. 16 includes the first reservoir 21 for the metal alkoxide, the second reservoir 22 for the gelation initiator solution, a first nozzle 21c connected to the first reservoir 21, and a second nozzle 22c connected to the second reservoir 22. The nozzles 21c and 22c separately supply the metal alkoxide and the gelation initiator solution, respectively. These solutions may be simultaneously supplied dropwise from the first nozzle 21c and the second nozzle 22c, as shown in FIG. 16. Alternatively, the metal alkoxide may be supplied dropwise from the first nozzle 21c to form a metal alkoxide film, as shown in FIG. 17A, and then the gelation initiator solution may be supplied dropwise from the second nozzle 22c, as shown in FIG. 17B. In this case, the start of the gelation reaction is the time when the gelation initiator solution is supplied dropwise onto the substrate 10.

The second type of wet-gel film forming means can control the gelation reaction rate of the wet-gel film formed on the substrate by the composition and the volume of the gelation initiator solution when any of the configurations shown in FIGS. 14 to 16 is used.

When the volume of the gelation initiator solution discharged from the second reservoir is controlled, the wet-gel film forming means 20' or 20" shown in FIGS. 15 or 16, respectively, may be used, and a controller which controls the volume of the gelation initiator solution may be provided to the pipe 22b or the second nozzle 22c, respectively. When the composition of the gelation initiator solution is controlled, second composition control means is provided to prepare a mixture having a predetermined composition of water from a water reservoir, a gelation promoter from a gelation promoter reservoir, and a gelation retarder from a gelation retarder reservoir. The second composition controlling means includes pumps for supplying predetermined amounts of materials from these reservoirs and an operational section which determines the volumes of these materials. A composition which is selected by the composition selecting means of the substrate supporting means is input to the operational section.

The second type of wet-gel film forming means is also applicable to the first method for controlling the degree of gelation. In this case, the composition and the amount of the gelation initiator solution is the same for all the substrates in one lot. Thus, a constant volume of gelation initiator solution is supplied onto the substrate from the second reservoir.

Spray-coating-type nozzles may be used instead of a drip nozzles in the supplying means shown in FIGS. 14 to 17B.

Figure 18:
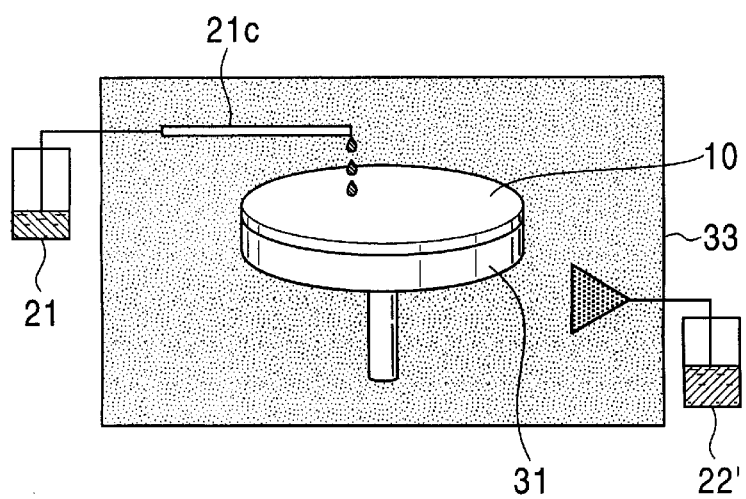
FIG. 18 is a schematic view of an embodiment of a wet-gel film forming means which supplies a gelation promoter and/or a gelation retarder in a gaseous state.

When the gelation promoter and/or the gelation retarder are supplied in a gaseous state, as shown in FIG. 18, a turntable 31 is placed in a hermetically sealed container 33, and the gaseous gelation initiator is supplied to the hermetically sealed container 33 from the second reservoir 22' by being sprayed or by being blown. The metal alkoxide is supplied from the first nozzle 21c connected to the first reservoir 21, as in the wet-gel film forming means 20" shown in FIG. 16. The metal alkoxide is supplied dropwise onto the substrate 10, and then the gaseous gelation initiator is supplied into the hermetically sealed container 33 so that the metal alkoxide film is exposed to the gaseous gelation initiator. The gelation reaction of the metal alkoxide is controlled by the gaseous gelation initiator.

Holding means C

The holding means is a container which contains at least one wet-gel-film-substrate. When a plurality of aerogel films are formed on substrates with high efficiency, the holding means is necessary. When a wet-gel-film-substrate is independently produced, the substrate supporting means may be the holding means. That is, the wet-gel-film-substrate may be placed on the turntable before the supercritical or subcritical drying process starts.

In both cases, the holding means preferably has a hermetically sealed structure so that the gelation reaction is unaffected by the ambient environment (temperature and humidity). When the holding container is the hermetically sealed container, supercritical or sub-critical drying can be performed in the holding container. Moreover, the hermetically sealed holding container can be filled with saturated vapor of alcohol and water so as to prevent drying of the wet-gel film and to suppress rapid hydrolysis of the metal alkoxide. The holding container is preferably composed of a noncorroding material, such as stainless steel, which is not corroded by solvents during the supercritical or sub-critical drying process.

When the holding container is not a hermetically sealed container, the holding means preferably includes a holding container and a hermetically sealed container. The supercritical or sub-critical drying process is preferably performed in the hermetically sealed container. The hermetically sealed container is also preferably composed of a noncorroding material, such as stainless steel, which is not corroded by solvents during the supercritical or sub-critical drying process.

The holding means used in the present invention preferably has temperature-controlling means. The temperature controlling means may be a heater or cooler provided with a regulator. The heater or cooler may be attached to the holding container or the hermetically sealed container, if the hermetically sealed container is provided.

The temperature controlling means promotes or decelerates the gelation reaction. That is, the temperature controlling means controls the temperature in the holding container to change the gelation reaction rate depending on the temperature. For example, the holding container is maintained at a low temperature, which can suppress the gelation reaction, before a predetermined number of wet-gel-film-substrates are prepared, and then the holding container is heated to promote the gelation reaction, as the first method for controlling the degree of gelation. When a gelation retarder, which can be pyrolyzed, such as formic acid or acetic acid, is used, the predetermined number of wet-gel-film-substrates are prepared and are then heated by the temperature controlling means to decompose the gelation retarder and to promote the gelation reaction, as the first method for controlling the degree of gelation. When a gelation promoter is used, a first wet-gel-film-substrate is placed into the holding container maintained at a low temperature, and then subsequent wet-gel-film-substrates are placed into the holding container while gradually increasing the temperature so that the degrees of gelation of the wet-gel films are substantially the same at the start of the supercritical or sub-critical drying process, in order to perform the first method for controlling the degree of gelation. When the second method for controlling the degree of gelation is employed, the holding container may be heated by the temperature controlling means to promote the gelation reaction.

Figure 19:
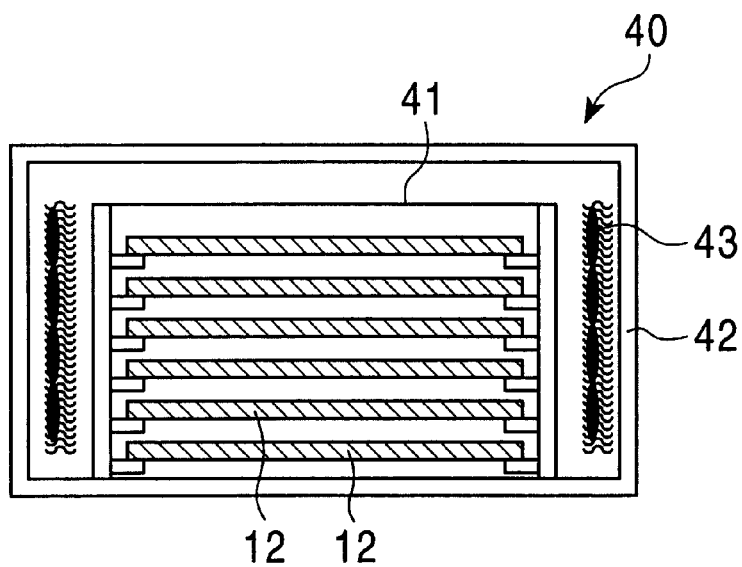
FIG. 19 is a schematic cross-sectional view of a holding means provided with an electromagnetic wave irradiation section.

The holding means in accordance with the present invention may be provided with electromagnetic wave irradiation means, in addition to the temperature controlling means. The electromagnetic wave irradiation means may be provided on an outer wall or on an inner wall of the holding container. A holding means 40 shown in FIG. 19 includes a holding container 41 placed in a hermetically sealed container 42. Ultraviolet lamps as an electromagnetic wave irradiation means 43 are provided on inner walls of the holding container 41. By a combination of such a holding means 40 and a gelation retarder, which can be decomposed by electromagnetic wave irradiation, such as formic acid or acetic acid, the gelation reaction is released from the suppression by electromagnetic wave irradiation when the predetermined number of wet-gel-film-substrates are prepared, in order to perform the first method for controlling the degree of gelation.

Supercritical or sub-critical Drying Means D

Any conventional supercritical or sub-critical drying apparatus can be used as the supercritical or sub-critical drying means in accordance with the present invention. A typical apparatus uses carbon dioxide as a supercritical or sub-critical fluid. Carbon dioxide is circulated in an autoclave while maintaining the pressure and the temperature of the autoclave at 100 atm and 80° C., respectively, for approximately 2 hours so that carbon dioxide replaces the solvent, such as ethanol, contained in the wet-gel-film-substrate. Next, the pressure is reduced to 1 atm while maintaining the temperature at 80° C., and then the temperature is decreased to room temperature. The supercritical or sub-critical drying process is thereby completed.

Supercritical or sub-critical Drying Control Means E

The supercritical or sub-critical drying control means is provided to initiate supercritical or sub-critical drying when the degree of gelation of the wet-gel film on the substrate held on the holding means reaches the predetermined value G.

The degree of gelation and thus the porosity of the aerogel film formed by drying is proportional to the holding time, and the dielectric constant of the aerogel film is proportional to the holding time. For example, a mixed solution of 30 g of tetramethoxysilane, 70 g of ethanol, 14 g of water, and 0.1 g of 30%-aqueous ammonia is supplied onto three substrates to form wet-gel-film-substrates having a wet-gel film thickness of 0.5 $\mu$m so that the elapsed times or gelation times from the time when the solution is supplied onto the substrates to the start of the supercritical or sub-critical drying process are 5 minutes, 50 minutes, and 2 hours, respectively. The degree of gelation of the wet-gel film at each gelation time is measured by infrared absorbance, and the porosity and the specific dielectric constant of the aerogel film prepared by the supercritical or sub-critical drying process are measured. The results are shown in Table 2.

TABLE 2

| Gelation Time | 5 min. | 50 min. | 2 hrs. |
| --- | --- | --- | --- |
| IR Absorbance (%) | 50 | 80 | 98 |
| Specific Dielectric Constant | 3.0 | 2.3 | 1.7 |
| Porosity (%) | 33 | 56 | 76 |

As shown in Table 2, the specific dielectric constant of the aerogel film, which is prepared from the same stock solution and has the same thickness, depends on the elapsed time or the gelation time. That is, the porosity increases and the dielectric constant decreases over the gelation time. On the other hand, significantly vigorous gelation reaction causes the formation of a granular wet gel, and thus no film is formed. Thus, the supercritical or sub-critical drying process must be started when the degree of gelation of the wet-gel film reaches the predetermined value G in order to form an aerogel film having a low dielectric constant and a low signal loss. The predetermined degree of gelation G can achieve a porosity of 85 to 99% (corresponding to a relative IR absorbance at 1,035 cm$^{-1}$ of at least 90%) so that the specific dielectric constant is 1.5 or less. When one lot of substrates is simultaneously subjected to a supercritical or sub-critical drying process, the degrees of gelation of the wet-gel films must reach the predetermined value G at substantially the same time.

The supercritical or sub-critical drying control means used in the present invention outputs signals for starting drying to the supercritical or sub-critical drying means and the holding means, if necessary, when the degree of gelation of the wet-gel film reaches the predetermined value G.

When it is known that the degree of gelation of the wet-gel film, which is formed on the substrate on the holding means, reaches the predetermined degree of gelation at a predetermined time, the supercritical or sub-critical drying process can start at the predetermined time.

When one lot of substrates is produced using the second method for controlling the degree of gelation and when the time J when the degrees of gelation of the wet-gel films reaches substantially the same level G at the predetermined time is known by calculation, signals for initiating the supercritical or sub-critical drying process are output at the time J. In such a case, the supercritical or sub- critical drying control means includes a calculation unit for determining the time J when the degrees of gelation reach substantially the same level, and a first supercritical or sub-critical initiating unit which submits a command for initiating the supercritical or sub-critical drying to the holding means and/or the supercritical or sub-critical drying means.

When the starting time of the supercritical or sub-critical drying process is not determined, the supercritical or sub-critical drying control means is preferably provided with a gelation measuring unit for measuring the degree of gelation of the wet-gel film on the substrate held on the holding means and a second supercritical or sub-critical initiating unit for initiating the supercritical or sub- critical drying when the degree of gelation of the wet-gel film measured by the gelation measuring unit reaches a predetermined value.

The gelation measuring unit determines the degree of gelation of the wet-gel film by light absorption or light scattering, as described above.

The second supercritical or sub-critical initiating unit determines, using a comparator, whether or not the data, such as absorption at 1,035 cm$^{-1}$, from the gelation measuring unit such as an infrared absorption spectrometer is at the predetermined level, and submits signals for initiating the supercritical or sub-critical drying at the predetermined value to the holding means and/or the supercritical or sub-critical drying means. A microcomputer is preferable as such a unit.

The apparatus for making the aerogel film in accordance with the present invention comprises any combination of the above embodiments of each means, according to the manufacturing method.

EXAMPLES

The method and apparatus for making the aerogel film of the present invention will now be described with reference to the following Examples.

FIRST METHOD FOR CONTROLLING DEGREE OF GELATION

Example 1

An apparatus for making an aerogel film applicable to the first method for controlling the degree of gelation was used. That is, the apparatus includes a holding means and a temperature controlling means. The wet-gel film forming means shown in FIG. 16 was used. The port of a first nozzle from the first reservoir for the metal alkoxide and the port of a second nozzle from the second reservoir for the gelation initiator solution are placed above the substrate on the turntable.

A mixed solution of 30 g of tetramethoxysilane as an alkoxide solution and 70 g of ethanol was contained in the first reservoir, and a mixed solution (gelation initiator solution) of 1 g of ammonia as a gelation promoter, 1 g of formic acid, and 100 g of water was contained in the second reservoir. The substrate was composed of silicon provided with an oxide film having a thickness of 2,000 Å thereon.

While the substrate was supported on the turntable by vacuum chucking and was rotated at 3,000 rpm, droplets of the alkoxide solution were supplied from the first nozzle to form an alkoxide film on the substrate. Next, droplets of the gelation initiator solution were supplied from the second nozzle to form a first wet-gel film having a thickness of 0.5 $\mu$m.

Figure 20:
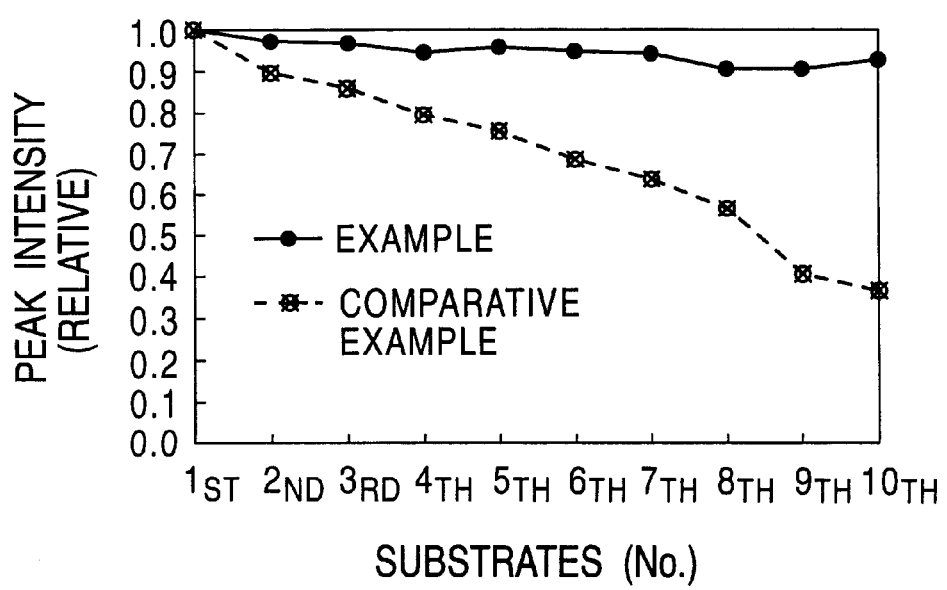
FIG. 20 is a graph showing the degrees of gelation of Example 1 and Comparative Example 1.

The first wet-gel film was held in the holding container in which the gelation reaction started in the wet-gel film. Nine more wet-gel-film-substrates (second to tenth substrates) were prepared and held in the holding container by the same procedure. After the ten wet-gel-film-substrates were held in the holding container, the holding container was heated to 60° C. While the degree of gelation of the first wet-gel film was measured by Fourier transform infrared (FTIR) spectroscopy, the supercritical or sub-critical drying process was initiated when the absorbance reached 100%. The peak intensities at 1,035 cm$^{-1}$ due to a stretching mode of the Si—O—Si bond were measured for the first to tenth wet-gel-film-substrates at the time immediately before the supercritical or sub-critical drying process, that is, at the time when the absorbance of the first wet-gel-film-substrate reached 100%. The results are shown in FIG. 20.

In the supercritical or sub-critical drying process, carbon dioxide was supplied into a dried container, and the pressure and the temperature were increased to 160 atm and 80° C., respectively. The pressure and the temperature were maintained for approximately 1 hour while supplying carbon dioxide to replace ethanol contained in the wet-gel films with carbon dioxide. The pressure was decreased to 1 atm while maintaining the temperature at 80° C., and then the temperature was decreased to room temperature. An aerogel film having a porosity of at least 50% was formed on each substrate without shrinkage or cracking of the wet-gel films due to surface stress.

Comparative Example 1

First to tenth wet-gel-film-substrates were prepared as in Example 1, but a mixed solution of 100 g of water and 1 g of ammonia as a gelation initiator solution was used instead. These wet-gel-film-substrates were placed into a holding container and were subjected to supercritical or sub-critical drying. The FTIR peak intensities of the wet-gel films on these substrates were measured as in Example 1 and the supercritical or sub-critical drying process was started when the absorbance of the first wet-gel film reached 100%. FIG. 20 shows the degrees of gelation of the first to tenth wet-gel-film-substrates immediately before the supercritical or sub-critical drying process.

In FIG. 20, the peak intensities of the second to tenth wet-gel-film-substrates are represented by the relative value to the peak intensity of the first wet-gel-film-substrate. The first to tenth wet-gel-film-substrates of Example 1 have substantially the same peak intensity, whereas, in Comparative Example 1, the peak intensity is the highest for the first wet-gel-film-substrate, gradually decreases in the order of preparation, and is the lowest for the tenth wet-gel-film-substrate. That is, in Comparative Example 1, the degree of gelation is proportional to the holding time, since no gelation retarder is used. In contrast, in Example 1, formic acid as the gelation retarder suppresses the gelation reaction during the preparation of the ten wet-gel-film-substrates so that the degree of gelation is substantially the same at the start of the supercritical or sub-critical drying process.

SECOND METHOD FOR CONTROLLING DEGREE OF GELATION

Example 2

Figure 21:
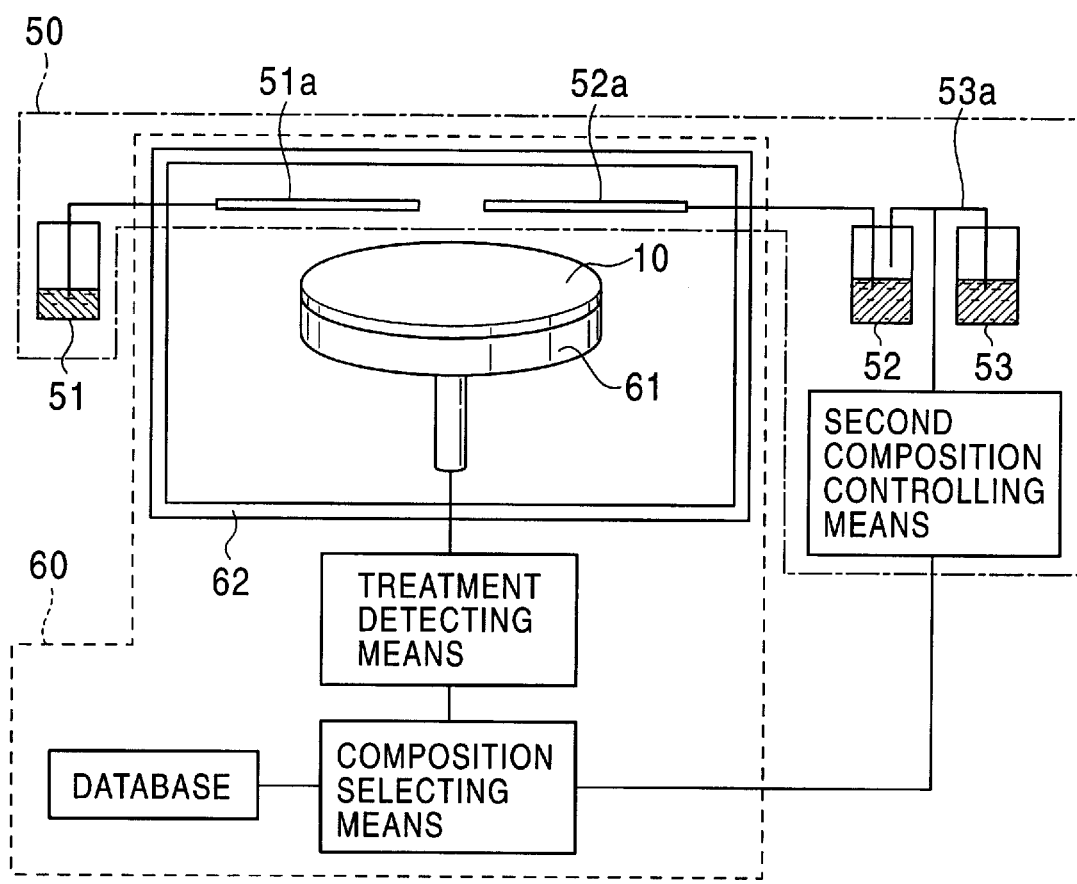
FIG. 21 is schematic view of an apparatus for making an aerogel film using a second method for controlling the degree of gelation.

FIG. 21 shows an apparatus for forming aerogel films using the second method for controlling the degree of gelation. The apparatus includes a wet-gel film forming means 50 and a substrate supporting means 60. The substrate supporting means 60 includes a hermetically sealed container 62 and a turntable 61 provided in the hermetically sealed container 62. The turntable 61 fixes by vacuum and rotates a substrate 10. The turntable 61 is connected with a sensor as a treatment detecting means which detects and records the timing of treatment of the substrate 10 on the turntable 61. The treatment detecting means is connected to a computer as a composition selecting means. The composition selecting means selects the holding time of the substrate 10 for the supercritical or sub-critical drying process and the type and the concentration of the gelation promoter for achieving a predetermined degree of gelation at the holding time, based on a database, and outputs the results to a second composition controlling means provided in the wet-gel film forming means 50. The database contains the type, the concentration, and the reaction rate of the gelation promoter, and the time required for the predetermined degree of gelation.

The wet-gel film forming means 50 includes a first reservoir 51 containing a metal alkoxide, a first nozzle 51a for supplying the metal alkoxide from the first reservoir 51 onto the substrate 10, a second reservoir 52 containing a gelation initiator solution, and a second nozzle 52 for supplying the gelation initiator solution from the second reservoir 52 onto the substrate 10. The second reservoir 52 is connected to a third reservoir 53 containing a gelation promoter by a third pipe 53a so that a predetermined amount of gelation promoter is supplied from the third reservoir 53 to the second reservoir 52 via the third pipe 53a, based on commands from the second composition controlling means. The second reservoir 52 contains water. When the predetermined amount of gelation promoter is added to the second reservoir 52, a gelation initiator solution which can achieve a required gelation reaction rate is prepared. The second composition controlling means is a pump provided with a microcomputer which determines the amount of the gelation promoter which is supplied from the third reservoir based on the results of the composition controlling means.

The wet-gel film forming means 50 supplies the metal alkoxide onto the substrate 10 from the first nozzle 51a and the gelation initiator solution having the predetermined gelation promoter concentration onto the substrate 10 from the second nozzle 52a.

The resulting wet-gel-film-substrate is held in the holding container as the holding means. In the holding container containing a predetermined number of wet-gel-film-substrates, when the first wet-gel-film-substrate reaches the predetermined degree of gelation, other wet-gel-film-substrates also reach the predetermined degree of gelation. Thus, the holding container is sealed and is placed into a supercritical or sub-critical drying machine (not shown in the drawing) to start the supercritical or sub-critical drying process.

What is claimed is:

1. An apparatus for making a predetermined number of substrates each having an aerogel film of substantially the same porosity, comprising:

substrate supporting means for supporting a substrate;

wet-gel film forming means for forming a wet-gel film on the substrate supported by the substrate supporting means;

holding means for holding substrates with the wet-gel films;

supercritical or sub-critical drying means for drying the substrate with the wet-gel films held in the holding means in a supercritical or sub-critical medium; and supercritical or sub-critical drying control means for initiating the supercritical or sub-critical drying by the supercritical or sub-critical drying means when a degree of gelation of each of the wet-gel films on the substrates held in the holding means reaches a predetermined value so that the wet-gel films are dried into the aerogel films of substantially the same porosity.

2. An apparatus according to claim 1, wherein the supercritical or sub-critical drying control means comprises:

a calculation unit for determining a time when the degree of gelation reaches a predetermined value; and a first supercritical or sub-critical initiating unit which submits a command for initiating the supercritical or sub-critical drying at the time.

3. An apparatus according to claim 1, wherein the supercritical or sub-critical drying control means comprises:

a gelation measuring unit for measuring the degree of gelation of the wet-gel films on the substrates held on the holding means; and a second supercritical or sub-critical initiating unit for initiating the supercritical or sub-critical drying when the degree of gelation of the wet-gel films measured by the gelation measuring unit reaches a predetermined value.

4. An apparatus according to claim 3, wherein the gelation measuring unit determines the degree of gelation of the wet-gel films by the intensity of light absorption or light scattering.

5. An apparatus according to claim 1, wherein the holding means is provided with temperature controlling means for controlling a gelation reaction rate of each of the wet-gel films.

6. An apparatus according to claim 1, wherein the holding means is provided with electromagnetic wave irradiation means for releasing a gelation reaction of the wet-get films from suppression.

7. An apparatus according to claim 1, wherein the substrate supporting means comprises:

detecting means for detecting a time when the wet-gel films are formed by the wet-gel film forming means; and composition selecting means for selecting at least one of type and amount of at least one of a gelation promoter and a gelation retarder in response to the time detected by the detecting means.

8. An apparatus according to claim 7, wherein the wet-gel film forming means comprises:

a reservoir containing a stock solution; said stock solution comprising a metal alkoxide, water, and said at least one of a gelation promoter and a gelation retarder; and stock solution supplying means for supplying the stock solution in the reservoir onto the substrate on the substrate supporting means.

9. An apparatus according to claim 8, wherein the wet-gel film forming means is provided with first composition controlling means for controlling the composition of the stock solution.

10. An apparatus according to claim 9, wherein the first composition controlling means determines at least one of type and concentration of at least one of the gelation promoter and the gelation retarder contained in the stock solution reservoir, based on results selected by the composition selecting means.

11. An apparatus according to claim 8, wherein the substrate supporting means rotates and supports the substrate, and comprises:

gelation measuring means for measuring the degree of gelation of the stock solution in the reservoir; and rotation controlling means for controlling the rotation rate of the substrate in response to the measured degree of gelation.

12. An apparatus according to claim 7, wherein the wet-gel film forming means comprises:

a first reservoir containing a metal alkoxide;

a second reservoir containing water initiating a gelation reaction of the metal alkoxide and at least one of a gelation promoter for promoting the gelation reaction and a gelation retarder for suppressing the gelation reaction; and supplying means for supplying the metal alkoxide from the first reservoir and said water and said at least one of a gelation promoter and a gelation retarder from the second reservoir onto the substrate.

13. An apparatus according to claim 12, wherein the wet-gel film forming means further comprises:

second composition controlling means for controlling at least one of type and amount of said at least one of a gelation promoter and a gelation retarder in the second reservoir.

14. An apparatus according to claim 13, wherein the second composition controlling means controls said at least one of type and amount of said at least one of a gelation promoter and a gelation retarder in the second reservoir, based on results selected by the composition selecting means.

* * * * *